(12) United States Patent
Nagai et al.

(10) Patent No.: US 10,461,722 B2
(45) Date of Patent: Oct. 29, 2019

(54) FREQUENCY SPREADING CIRCUIT

(71) Applicant: DENSO CORPORATION, Kariya, Aichi-pref. (JP)

(72) Inventors: Kazuhiro Nagai, Kariya (JP); Takuya Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/264,992

(22) Filed: Feb. 1, 2019

(65) Prior Publication Data

US 2019/0165798 A1 May 30, 2019

Related U.S. Application Data

(63) Continuation of application No. PCT/JP2018/012084, filed on Mar. 26, 2018.

(30) Foreign Application Priority Data

Mar. 28, 2017 (JP) .................................. 2017-62848

(51) Int. Cl.
| | |
|---|---|
| *H03K 3/013* | (2006.01) |
| *H03K 3/03* | (2006.01) |
| *H03L 7/099* | (2006.01) |
| *H03K 5/156* | (2006.01) |

(52) U.S. Cl.
CPC ........... *H03K 3/0315* (2013.01); *H03K 3/013* (2013.01); *H03K 5/156* (2013.01); *H03L 7/0995* (2013.01)

(58) Field of Classification Search
CPC ...... H03K 3/013; H03K 3/0315; H03K 5/156; H03L 7/0995
USPC ................................. 327/100, 113, 172, 176
See application file for complete search history.

(56) References Cited

U.S. PATENT DOCUMENTS

| | | | |
|---|---|---|---|
| 8,415,938 B2 | 4/2013 | Mori et al. | |
| 9,768,692 B2 | 9/2017 | Hosoyama | |
| 2008/0061893 A1* | 3/2008 | Lakshmikumar | .... H03K 3/0315 331/57 |
| 2008/0100350 A1* | 5/2008 | Pernia | ...................... H03L 5/00 327/114 |
| 2013/0093478 A1* | 4/2013 | Wong | ................... H03L 7/0995 327/156 |

* cited by examiner

*Primary Examiner* — William Hernandez
(74) *Attorney, Agent, or Firm* — Posz Law Group, PLC

(57) ABSTRACT

A ring oscillator is configured with a multiple number of logic inverting circuits in a ring shape and generates multi-phase clock signals. A period measuring unit measures a period of a reference clock inputted thereto by the multi-phase clock signals of the ring oscillator and outputs a measured period as a period data value. A frequency spreading calculation unit calculates a frequency spreading command value in accordance with a frequency spreading rate, a frequency spreading period and the period data value of the period measuring unit, which are inputted. A pulse generation unit generates a clock pulse corresponding to the frequency spreading command value in accordance with a data value determined by addition of the frequency spreading command value to the period data value.

9 Claims, 22 Drawing Sheets

| PWS[0] | PWS[1] | PWS[2] | PWS[3] | PWS[4] | CKP |
|---|---|---|---|---|---|
| 0 | 0 | 0 | 0 | 0 | RP[0] |
| 1 | 0 | 0 | 0 | 0 | RP[1] |
| 0 | 1 | 0 | 0 | 0 | RP[2] |
| 1 | 1 | 0 | 0 | 0 | RP[3] |
| 0 | 0 | 1 | 0 | 0 | RP[4] |
| 1 | 0 | 1 | 0 | 0 | RP[5] |
| 0 | 1 | 1 | 0 | 0 | RP[6] |
| 1 | 1 | 1 | 0 | 0 | RP[7] |
| 0 | 0 | 0 | 1 | 0 | RP[8] |
| 1 | 0 | 0 | 1 | 0 | RP[9] |
| 0 | 1 | 0 | 1 | 0 | RP[10] |
| 1 | 1 | 0 | 1 | 0 | RP[11] |
| 0 | 0 | 1 | 1 | 0 | RP[12] |
| 1 | 0 | 1 | 1 | 0 | RP[13] |
| 0 | 1 | 1 | 1 | 0 | RP[14] |
| 1 | 1 | 1 | 1 | 0 | RP[15] |
| 0 | 0 | 0 | 0 | 1 | RP[16] |
| 1 | 0 | 0 | 0 | 1 | RP[17] |
| 0 | 1 | 0 | 0 | 1 | RP[18] |
| 1 | 1 | 0 | 0 | 1 | RP[19] |
| 0 | 0 | 1 | 0 | 1 | RP[20] |
| 1 | 0 | 1 | 0 | 1 | RP[21] |
| 0 | 1 | 1 | 0 | 1 | RP[22] |
| 1 | 1 | 1 | 0 | 1 | RP[23] |
| 0 | 0 | 0 | 1 | 1 | RP[24] |
| 1 | 0 | 0 | 1 | 1 | RP[25] |
| 0 | 1 | 0 | 1 | 1 | RP[26] |
| 1 | 1 | 0 | 1 | 1 | RP[27] |
| 0 | 0 | 1 | 1 | 1 | RP[28] |
| 1 | 0 | 1 | 1 | 1 | RP[29] |
| 0 | 1 | 1 | 1 | 1 | RP[30] |
| 1 | 1 | 1 | 1 | 1 | RP[31] |

FREQUENCY SPREADING CIRCUIT

CROSS REFERENCE TO RELATED APPLICATION

The present application is a continuation application of International Patent Application No. PCT/JP2018/012084 filed on Mar. 26, 2018, which designated the U.S. and claims the benefit of priority from Japanese Patent Application No. 2017-62848 filed on Mar. 28, 2017. The entire contents of all of the above-referenced applications are incorporated herein by reference.

FIELD

The present disclosure relates to a frequency spreading circuit.

BACKGROUND

In recent years, it is proposed to cyclically change a PWM signal using a spectrum spreading technique, when a switching power supply device applies the PWM signal as its control signal. In this conventional power supply device, a switching frequency control unit generates a spectrum spreading signal whose period changes according to a clock signal. An output voltage detection unit detects an output voltage. A reference voltage unit generates a reference voltage. A difference calculation unit calculates a difference between the output voltage and the reference voltage. A compensator generates a compensation value based on an input voltage of the switching power supply unit, the reference voltage and the period of the spectrum spreading signal. A PWM generator generates a PWM signal based on the spectrum spreading signal and the compensation value. The reference voltage unit varies the reference voltage in accordance with a change in the period of the spectrum spreading signal. This conventional power supply device executes spectrum spreading processing by using a system clock.

SUMMARY

The present disclosure provides a frequency spreading circuit, which comprises a ring oscillator, a period measuring unit, a frequency spreading calculation unit and a pulse generation unit. The ring oscillator generates multi-phase clock signals. The period measuring unit measures a period of a reference clock, which is inputted, by the multi-phase clock signals of the ring oscillator and outputs a measured period as a period data value. The frequency spreading calculation unit calculates a frequency spreading command value in accordance with a frequency spreading rate, a frequency spreading period and the period data value of the period measuring unit, which are inputted. The pulse generation unit generates a clock pulse corresponding to the frequency spreading command value in accordance with a data value determined by addition of the frequency spreading command value to the period data value.

BRIEF DESCRIPTION OF THE DRAWINGS

The above and other objects, features and advantages of the present disclosure will become more apparent from the following detailed description made with reference to the accompanying drawings. In the drawings:

FIG. 4 is a diagram of a latch state of multi-phase clock signals of the RDL and a truth table of a priority encoder;
FIG. 11 is a diagram of a truth table of the selector.

EMBODIMENT

Figure 1:
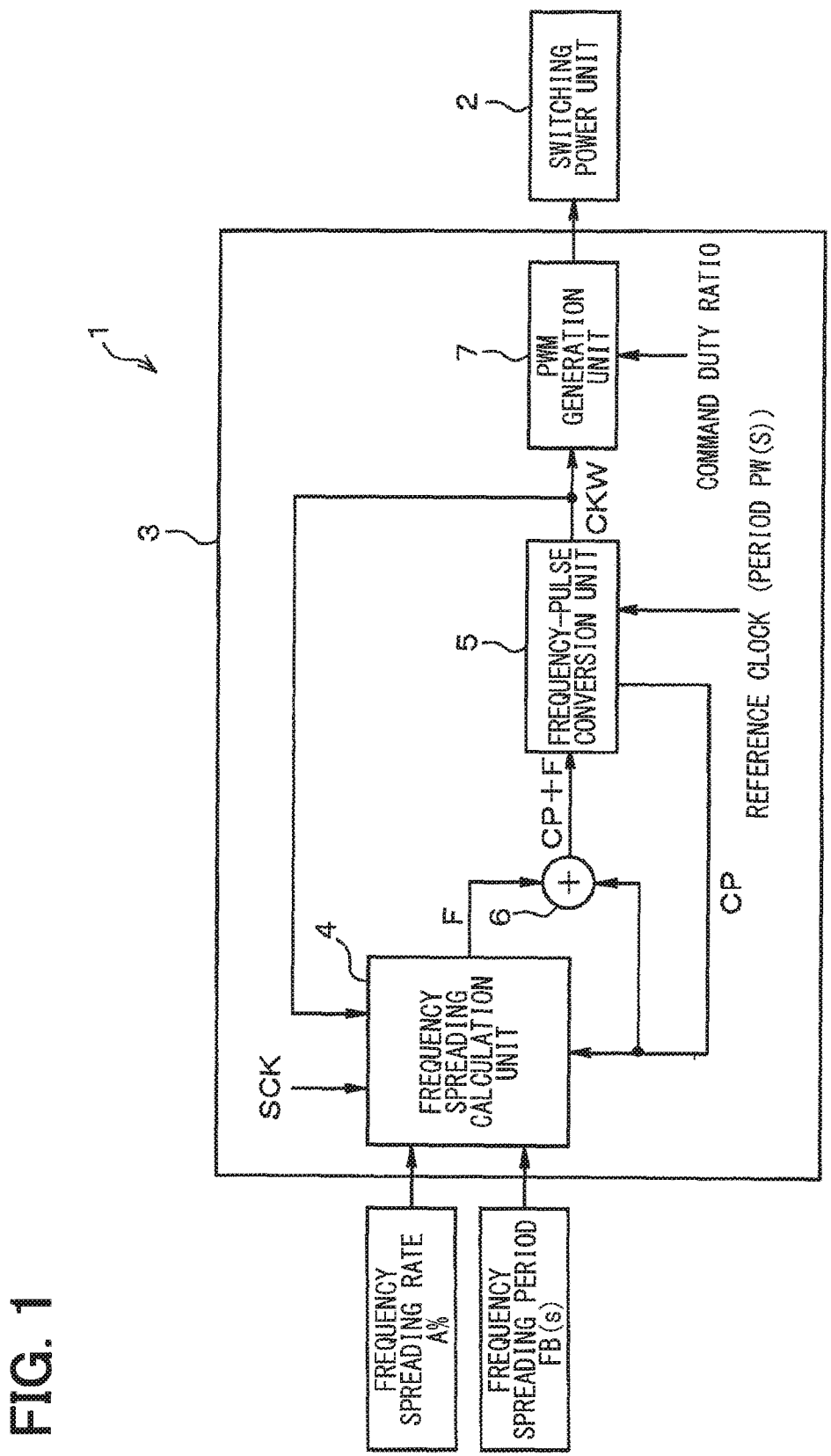
FIG. 1 is an electrical configuration diagram of a switching power supply device including a frequency spreading circuit according to a first embodiment.

Hereinafter, embodiments of a frequency spreading circuit will be described with reference to the drawings. In each embodiment, the same or similar configuration is denoted by the same or similar reference numeral to simplify the description.

First Embodiment

Hereinafter, a first embodiment of the present disclosure will be described with reference to FIG. 1 to FIG. 18. FIG. 1 shows a configuration of a switching power supply device 1. The switching power supply device 1 includes a switching power supply unit 2 and a frequency spreading circuit 3. The frequency spreading circuit 3 includes a frequency spreading calculation unit 4, a frequency-pulse conversion unit 5 as a pulse generation unit, an adder 6 as an addition unit, and a PWM generation unit 7.

The frequency-pulse conversion unit 5 measures each period PW(S) of a reference clock CLK, which is a train of pulses, and generates a clock pulse CKW of a carrier frequency for PWM generation based on a data value CP+F using a frequency spreading command value F generated by the frequency spreading calculation unit 4. The frequency-pulse conversion unit 5 outputs the clock pulse CKW to the frequency spreading calculation unit 4 and the PWM generation unit 7, generates the period data value CP of the reference clock CLK and outputs the same to the frequency spreading calculation unit 4 and the adder 6.

The PWM generation unit 7 generates a PWM signal of a PWM command duty ratio in a carrier frequency of the frequency (period) indicated by the clock pulse CKW, and outputs the PWM signal to the switching power supply unit 2. The switching power supply unit 2 generates a switching power supply voltage in accordance with the PWM signal generated by the PWM generation unit 7.

The frequency spreading calculation unit 4 receives data from an outside of the frequency spreading circuit 3 a frequency spreading factor A % and a frequency spreading period FB(s) as command values, for example, executes various calculation processing by receiving a system clock SCK, which is also a train of pulses, the clock pulse CKW and the period data value CP of the reference clock CLK of the frequency-pulse conversion unit 5, and outputs a frequency spreading command value F, which is used as a frequency control parameter, to the adder 6.

The adder 6 adds the frequency spreading command value F and the period data value CP of the reference clock CLK, which is output from the frequency-pulse conversion unit 5, and outputs resultant data CP+F to the frequency-pulse conversion unit 5. The frequency-pulse conversion unit 5 generates the clock pulse CKW based on the data CP+F and outputs it to the PWM generation unit 7.

Figure 2:
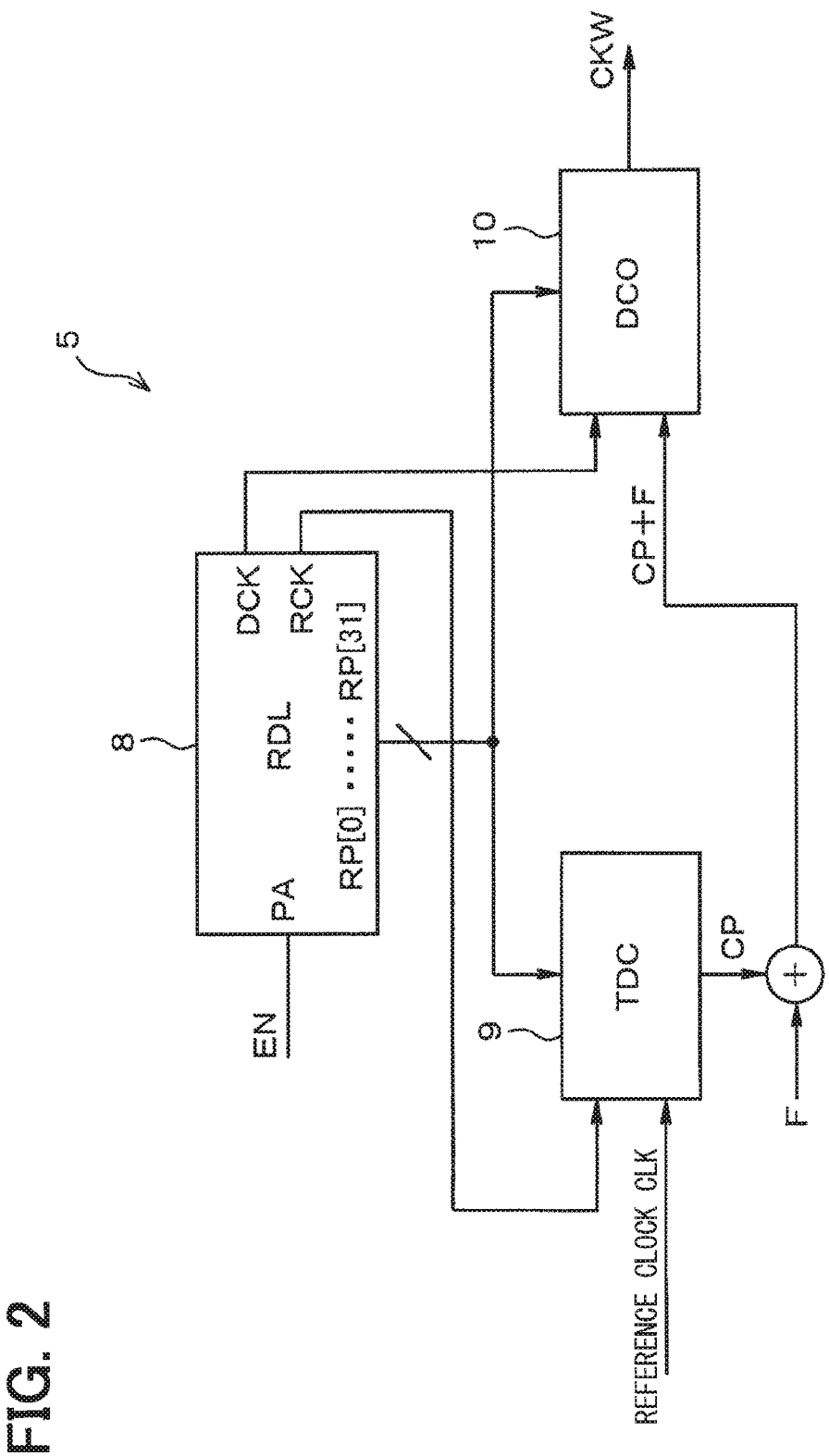
FIG. 2 is an electrical configuration diagram of a frequency-pulse conversion unit.

Hereinafter, more detailed configuration of these units will be described. FIG. 2 shows a configuration example of the frequency-pulse conversion unit 5. The frequency-pulse conversion unit 5 is configured by combining an RDL (ring delay line) 8 as a ring oscillator, a TDC (time-digital converter) 9 as a period measurement unit, and a DCO (digital control oscillator) 10.

The RDL 8 outputs multi-phase clock signals RP[0] to RP[31] to the TDC 9 and the DCO 10 when a signal EN is at a high level "H" ("0"). The RDL 8 outputs a clock signal DCK synchronized with the multi-phase clock signal RP[0], which is one of the multi-phase clock signals RP[0] to RP[31], to the DCO 10. The RDL 8 further outputs a clock signal RCK synchronized with the multi-phase clock signal RP[15], which is another one of the multi-phase clock signals RP[0], to RP[31] to the DCO 10.

<Configuration and Operation of RDL 8>

Figure 3:
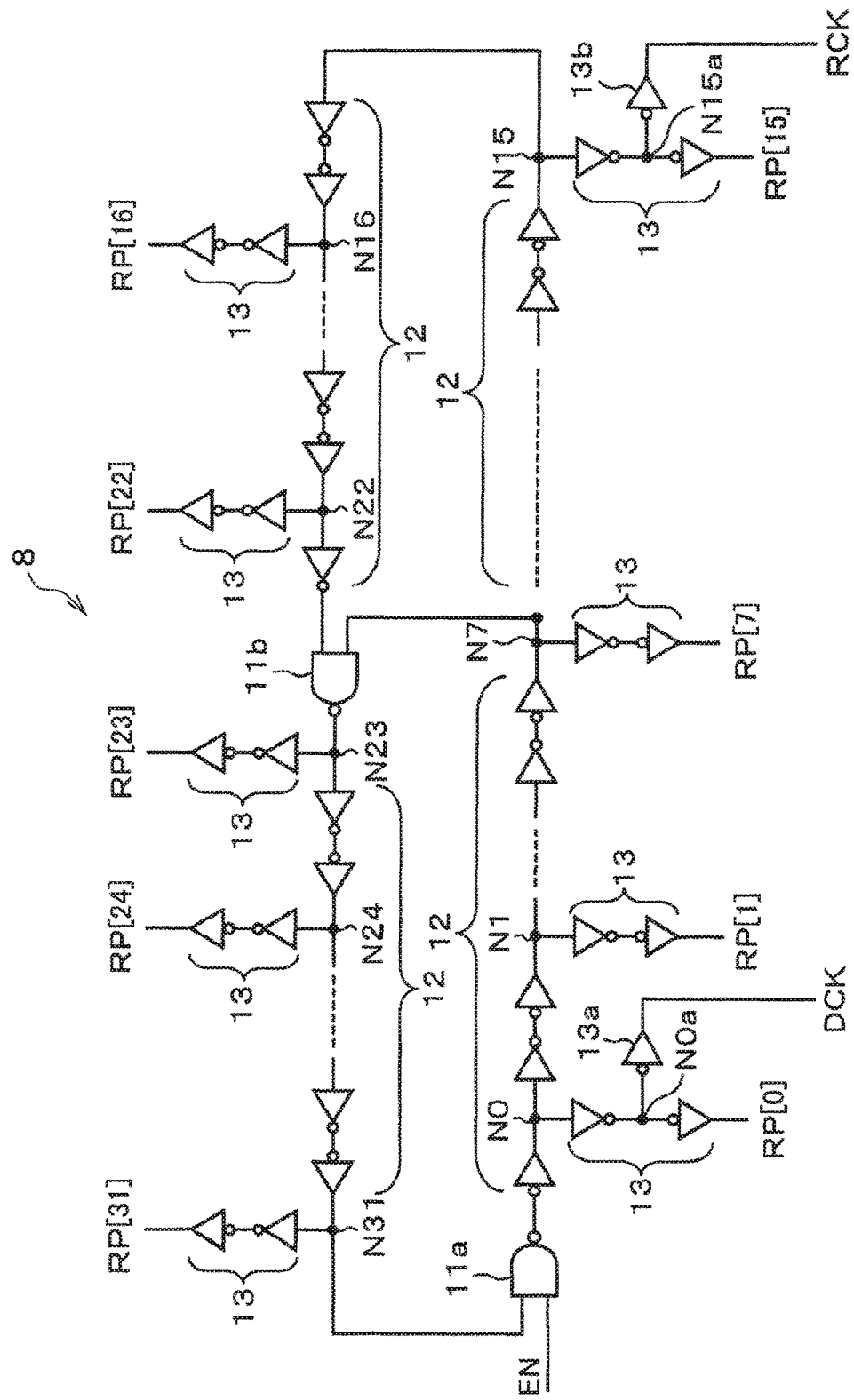
FIG. 3 is an electrical configuration diagram of an RDL.

As shown in the configuration example of the RDL 8 in FIG. 3, the RDL 8 includes two 2-input NAND gates 11a and 11b, an even number (e.g., 2×31) of logic inverting gates 12 and an even number (e.g., 2×32) of logic inverting gates 13. The NAND gates 11a and 11b and the logic inverting gates 12 and 13 are each configured as a logic inverting circuit and will be abbreviated as "logic inverting gate" below.

The logic inverting gates 11a, 11b and 12 are connected in a ring shape in such a manner that outputs of the logic inverting gates 11a, 11b and 12 are connected to inputs of the logic inverting gates 11a, 11b and 12 of the next stage. Defining that nodes N0 to N31 are in a ring shape as shown in FIG. 3, the nodes N0 to N31 are connected in the ring shape via logic inverting gates 11a, 11b and 12. In this configuration, an even number of logic inverting gates 11a, 11b and 12 are connected between the adjacent nodes N0 and N1, between N1 and N2, ..., between N30 and N31 and finally between N31 and N0.

The signal EN is input to one input node of the NAND gate 11a and an output of the logic inverting gate 12 of the ring-connected final stage is connected to the other input node N31. The NAND gate 11b is connected between the node N22 and the node N23. An output of the node N22 is input to one of the input nodes N22 and N23 via the logic inverting gate 12, and an output of the node N7 is input to the other node of the nodes N22 and N23.

The logic inverting gates 13 receive outputs of the corresponding nodes N0 to N31 connected in the ring form, respectively. Each logic inverting gate 13 is formed of the same number of gates (two in this example) to output a received signal without inversion by delaying a predetermined period Tg=2×Td. The logic inverting gates 13 thus output delayed signals as the multi-phase clock signals RP[0:31].

When the signal EN is at a low level "L" ("0"), an output level of the NAND gate 11a becomes "L" and an output level of the NAND gate 11b becomes "H". Thus, signal levels of the nodes N0 to N22 and the nodes N23 to N31 become "L" and "H", respectively, in a stable state.

Figure 4:
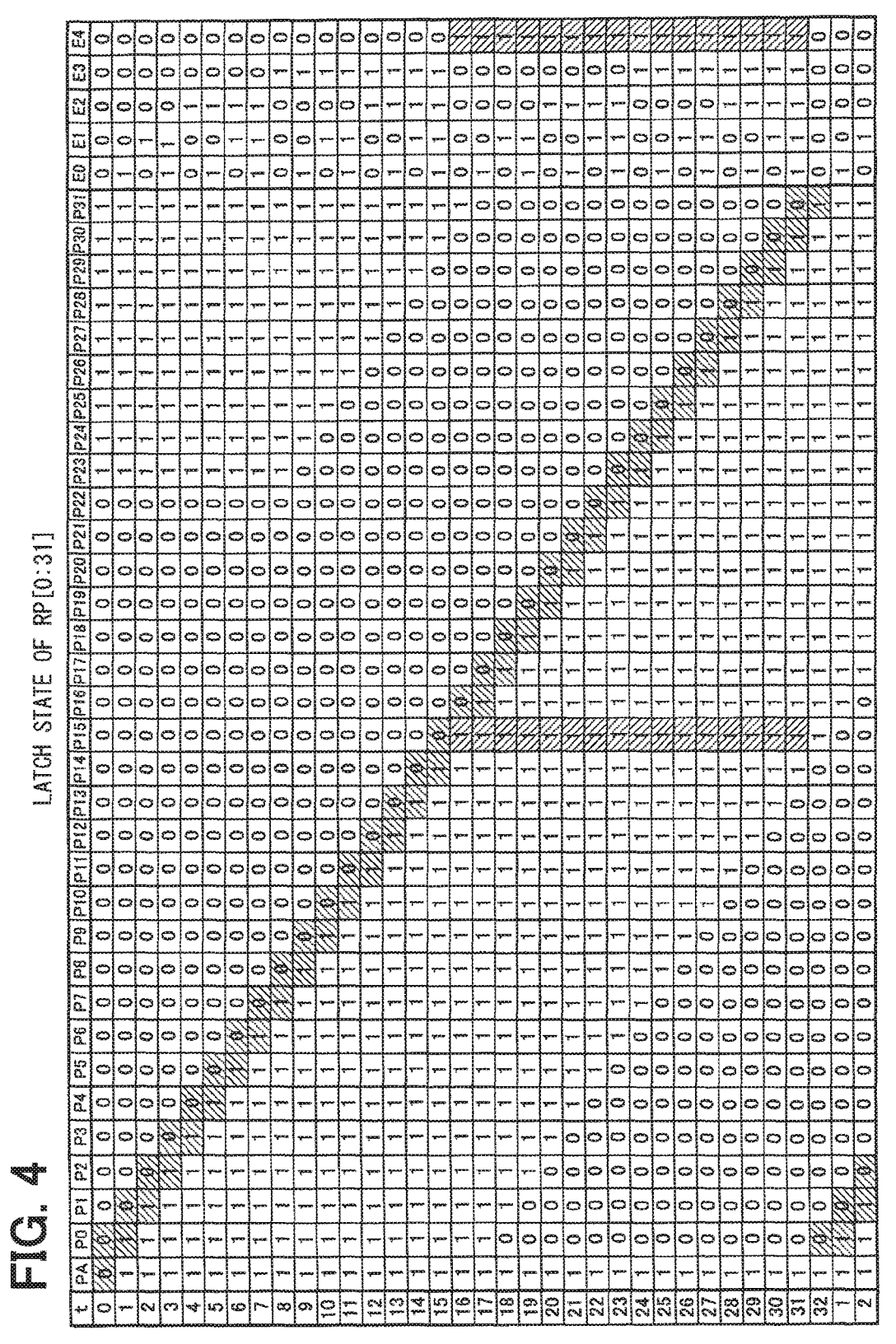

As a result, when the signal EN is "L", for example, the multi-phase clock signals of the least significant bits RP[22:0] and the multi-phase clock signals of the most significant bits RP[31:23] become "L" and "H", respectively, in a stable state. This state is equivalent to latch signals P31 to P0 (latch signals of a D flip-flop 16, which will be described later, of multi-phase clock signals RP [31:0]) at time t=0 shown in FIG. 4. PA in FIG. 4 represents the signal EN.

When the signal EN changes from "L" to "H", the output level of the NAND gate 11a is inverted and changes to "L". The logic inverting gates 11a, 11b, 12 and 13 all propagate at the edge with almost the same delay time Td. For this reason, as shown in FIG. 4, in which a vertical axis indicates time and a horizontal axis indicates changes in the latch state of the multi-phase clock signals RP [31:0], a rising level inversion propagates sequentially with time lapse (t= 1, ... ). As a result, the rising edge of the signal level from "L" to "H" sequentially propagate in sequence with lapse of time. In FIG. 4, the rising edge which is a main edge is hatched to the right.

When the signal level of the node N7 changes to "L" after a lapse of time, the output level of the NAND gate 11b is inverted to "L" and the signal level of the node N23 is also inverted to "L". Thereafter, the logic inverting gate 13 connected to the node N23 outputs the signal level "L" of the node N23 as the multi-phase clock signal RP[23] at time t=9 after the lapse of the delay time Tg=2×Td.

Following the lapse of time (t=10 ... ) after time t=9, the falling level inversion propagates sequentially. As a result, the falling edge which becomes a reset edge of the signal level from "H" to "L" also propagates sequentially. As a result, the rising edge and the falling edge circulate on the same circle. The RDL 8 continues its oscillation state without settling to a stable state as long as the signal EN is "H". The RDL 8 outputs multi-phase clock signals RP[0:31] having one period of 64×Td, assuming that a time period (namely, gate delay period) required for inverting operation of each logic inverting gate 11a, 11b and 12 is Td.

Further, as shown in FIG. 3, the logic inverting gate 13a receives a signal branched from an intermediate node N0a of the two logic inverting gates 13, from which the multi-phase clock signal RP[0] is outputted, and outputs the clock signal by inverting the received signal. As a result, the RDL 8 outputs the clock signal DCK synchronized with the multi-phase clock signal RP[0].

Further, the logic inverting gate 13b receives a signal branched from an intermediate node N15a of the two logic inverting gates 13, from which the multi-phase clock RP[15] is outputted, and outputs the clock signal RCK by inverting the received signal. As a result, the RDL 8 outputs the clock signal RCK synchronized with the clock signal RP[15]. For example, assuming that the gate delay period Td is 125 ps, the frequency of the circulating clock signals DCK and RCK is 125 MHz. These clock signals DCK and RCK change substantially complementarily as shown in the columns of P0 and P15 in FIG. 4.

<Configuration of TDC 9 and Block Operation>

The TDC 9 shown in FIG. 2 is formed of, for example, a 16-bit counter for measuring the period of the reference clock CLK, and outputs the period data value CP (=DA[15:0]) of the reference clock CLK to the adder 6 and the frequency spreading calculation unit 4. This reference clock CLK is a clock signal whose duty ratio is 50%. The carrier frequency of the reference clock CLK is, for example, about 2 MHz, and set to a significantly lower frequency than the frequency of the individual multi-phase clock signals RP[0] to RP[31] and the clock signals DCK and RCK. The period of the reference clock CLK is measured by the TDC 9.

Figure 5:
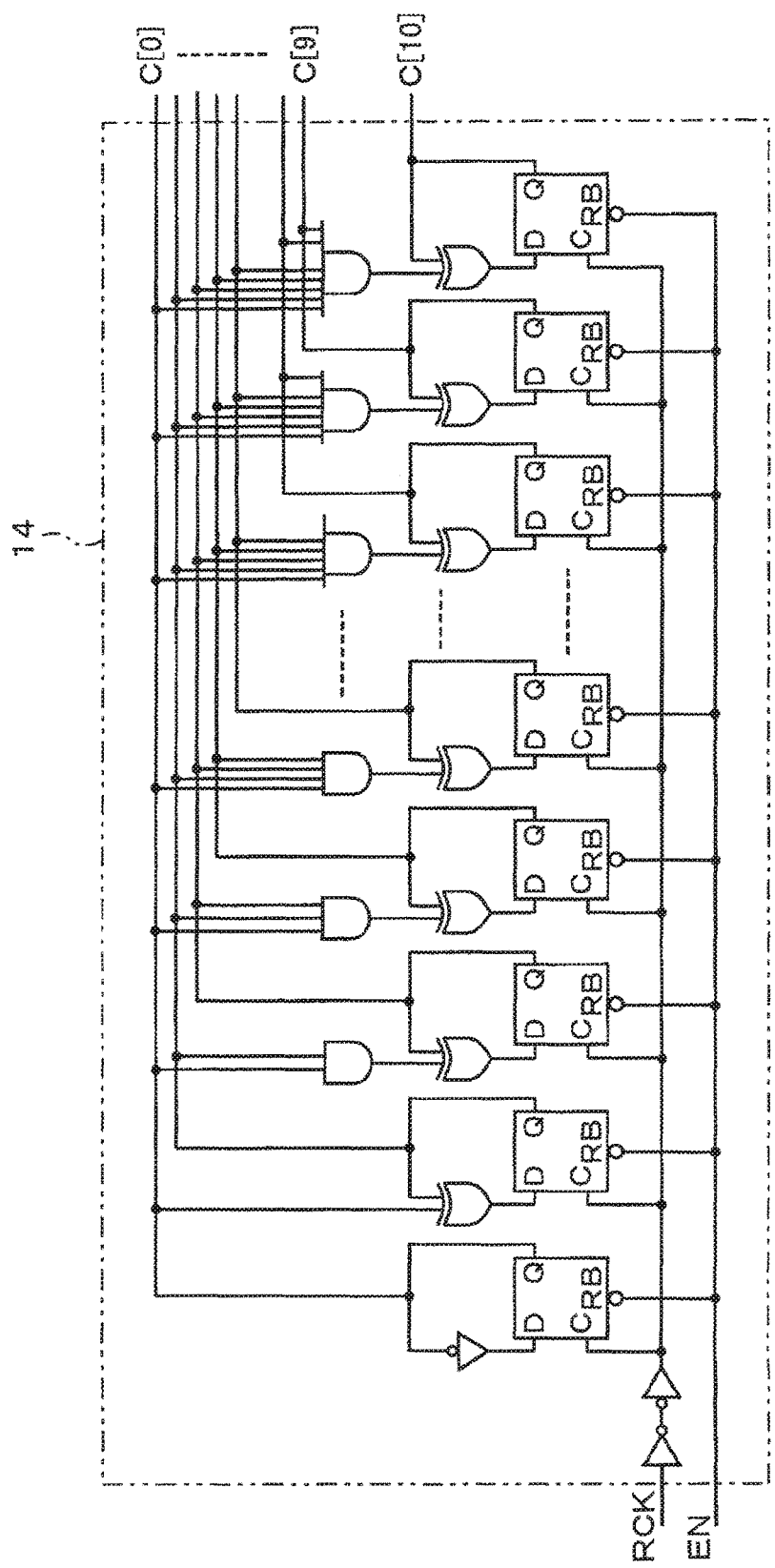
FIG. 5 is a first electrical configuration diagram of a TDC.
Figure 6:
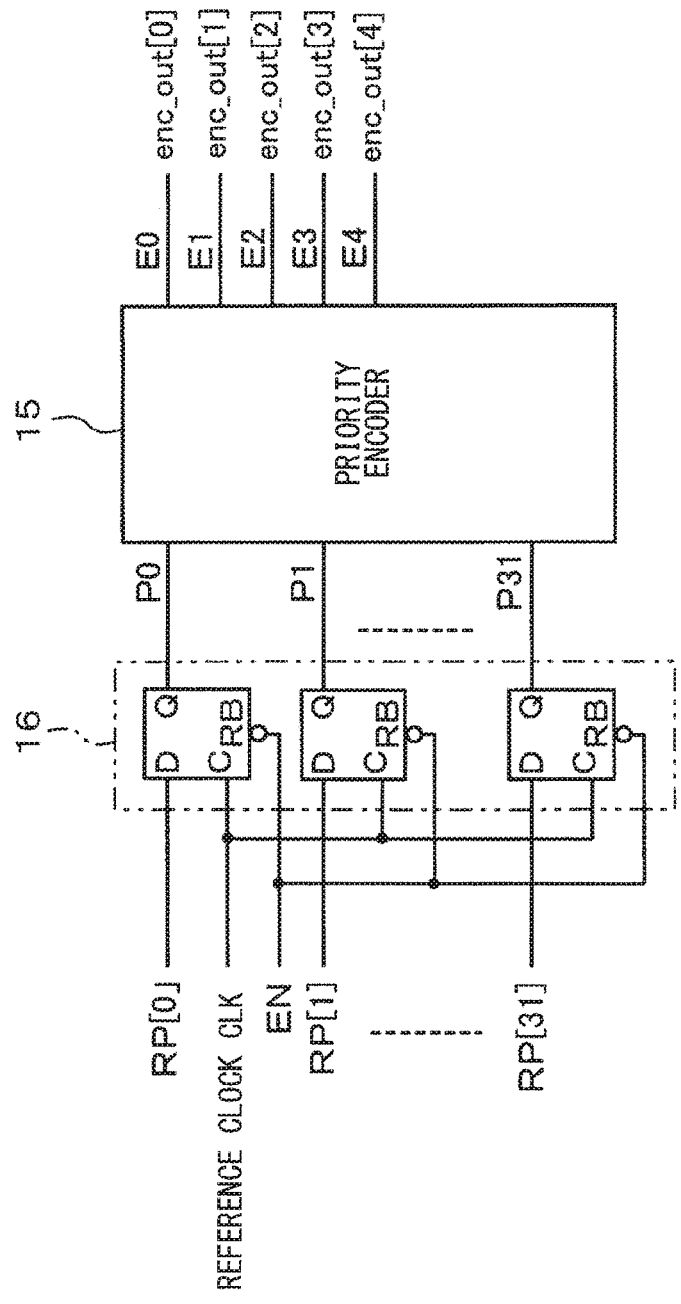
FIG. 6 is a second electrical configuration diagram of the TDC.
Figure 7:
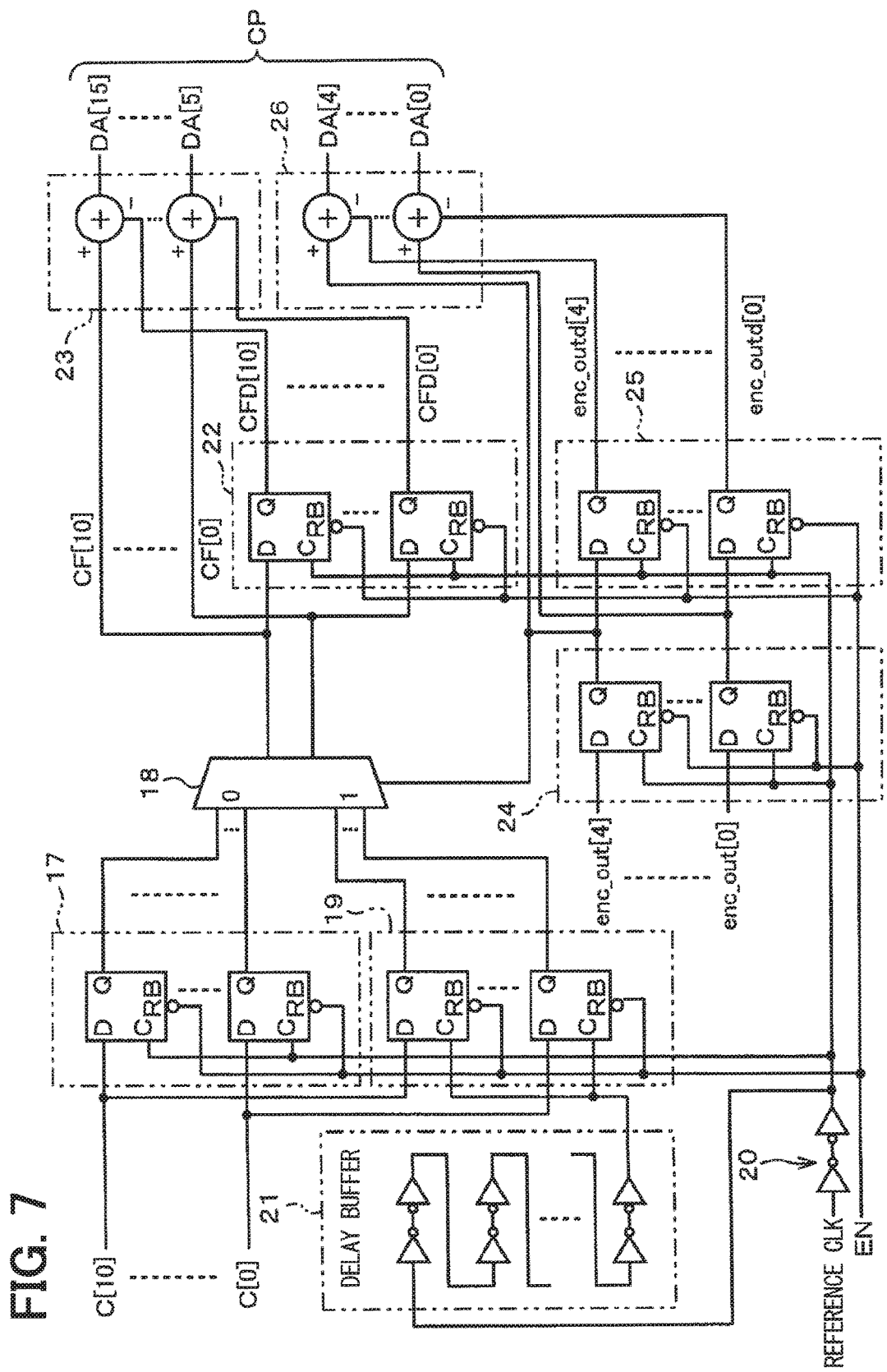
FIG. 7 is a third electrical configuration diagram of the TDC.

FIG. 5 to FIG. 7 show a configuration example of the TDC 9. The TDC 9 includes a circulation number counter 14 shown in FIG. 5 as well as a priority encoder 15 and a D flip-flop (abbreviated as D-FF or DFF) 16, which are shown in FIG. 6. The TDC 9 further includes various other configurations such as D flip-flops 17, 19, 22, 24, 25, a multiplexer 18, a buffer 20, a delay buffer 21 and subtracters 23, 26.

For example, the circulation number counter 14 is an 11-bit free-run counter combining various gates in the form shown in FIG. 5. It starts a counting operation of the clock signal RCK when the signal EN becomes "H", and outputs a count value C[10:0], for example. Since the circulation number counter 14 has a general configuration, a detailed description thereof will not be made.

Further, a D-FF 16, which is a set of 32 D-FFs, are provided on an input side of the priority encoder 15 as shown in FIG. 6. The multi-phase clock signals RP[31:0] are applied to inputs of the D-FF 16. When the signal EN becomes "H" and the reset is canceled, D-FF 16 latch the multi-phase clock signals RP[31:0] at the rising time of the reference clock CLK and outputs latch signals P[31:0] to the priority encoder 15 (see FIG. 4).

The priority encoder 15 encodes the latch signals P[31:0]. FIG. 4 also shows a truth table of the priority encoder 15. The priority encoder 15 encodes the latch signals P[31:0] and outputs an encoded value E[4:0]. Hereinafter, the encoded values E4 to E0 are expressed as the encoded signal enc_out[4:0].

The latch signals P[31:0] of the D-FF 16 shown in FIG. 4 indicate each time difference between the rising time of the reference clock CLK and the rising time of the multi-phase clock signals RP[0] to RP[31] in the form of digital data at certain time. The encoded signal enc_out[4:0] indicate the encoded value of each of these time differences. Therefore, if the delay time Td of the logic inverting gates 11a, 11b, 12 and 13 of the RDL 8 changes due to various influences, the encoded signal enc_out[4:0] also change following this change.

The count value C[10:0] of the circulation number counter 14 is input to the most significant 11 bits of the D-FF 17, which is a set of D-FFs, as shown in FIG. 7. The D-FF 17 operates when the signal EN becomes "H", latches the count value C[10:0] at the rising time of the delay period of the buffer 20 of the reference clock CLK, and supplies the latch signal to a [0] input of the multiplexer 18.

The count value C[10:0] of the circulation number counter 14 is also input to D inputs of the most significant 11 bits of the D-FF 19, which is a set of D-FF. The D-FF 19 also operate when the signal EN becomes "H", latches the count value C[10:0] at the rising time of the reference clock CLK, and outputs the latched signals to a [1] input of the multiplexer 18.

Therefore, the latched signals of the D-FF 17 and 19 represent in a digital data form the circulation number count value C[10:0] of the clock signal RCK of the circulation number counter 14 at the rising time of the reference clock CLK, Even when the delay periods Td of the logic inverting gates 11a, 12 and 13 change due to various influences, the latched signals of the D-FF 17 and 19 change following this change.

Of the D-FF 17 and 19, the reference clock CLK is input to C inputs of the D-FF 17 via the buffer 20 of one stage while the reference clock CLK is input to C inputs of the D-FF 19 via the buffer 20 as well as via a delay buffer 21 which is an eight-stage buffer. The multiplexer 18 selects the output of one of the D-FF 17 and 19 according to a Q output of the D-FF of the encoded signal enc_out[4], and outputs it as the circulation number count value CF[10:0]. According to this configuration, although the signals to be selected by the multiplexer 18 at the "L" input and the "H" input are both the count value C[10:0], these input times are made different from each other by the delay buffer 21.

Figure 8:
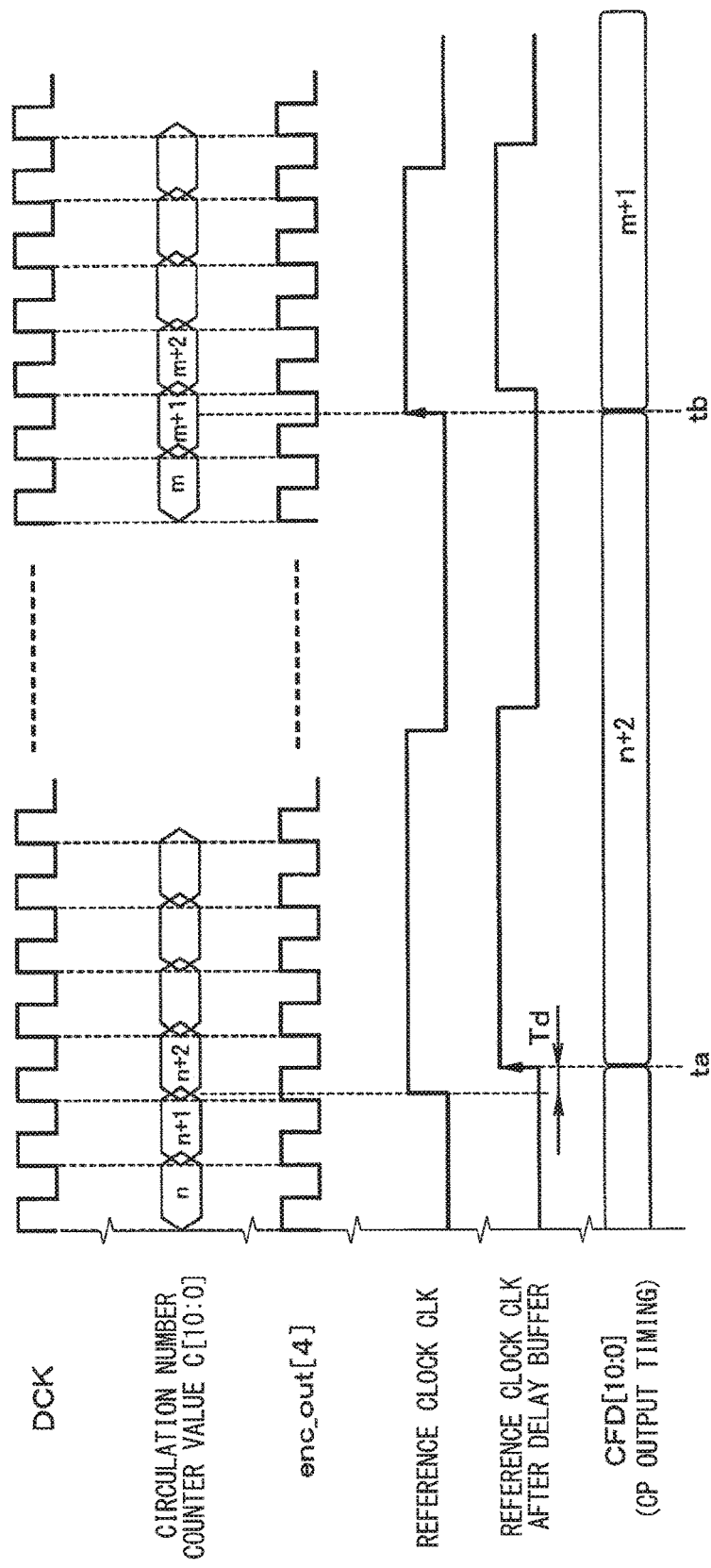
FIG. 8 is a time chart of the TDC.

FIG. 8 is an explanatory diagram for explaining this reason. The signal to be counted by the circulation number counter 14 is a circulating clock signal RCK synchronized with the multi-phase clock signal RP[15]. Therefore, when the count value C[10:0] of the circulation number counter 14 changes at time close to the time at which the encoded signal enc_out[4] of the priority encoder 15 becomes "H", the count value C[10:0] may be undefined. In FIG. 4, times t=16 to 31 at which the encoded signal enc_out[4]="H" are shown diagonally hatched to the left.

In order to prepare for such a case, the D-FF 19 are configured to latch the count value C[10:0] of the circulation number counter 14 at the rising time of the reference clock CLK passing through the buffer 20 and the delay buffer 21. The delay period of the delay buffer 21 is set to about ¼ to ⅓ of one circulation period of the RDL 8. Therefore, at time to in FIG. 8, the circulation number counter value C[10:0] is latched at the rising time of the reference clock CLK having passed through the buffer 20 and the delay buffer 21. Thus, the data "n+2" can be acquired in a stable state. The delay period of the delay buffer 21 is desirably appropriately set so as to be a time period required for the count value C[10:0] of the circulation number counter 14 to be stabilized.

Conversely, during a period (t=1 to t=15 in FIG. 4) in which the encoded signal enc_out [4] of the priority encoder 15 is "L", the data remains stable even after the output count value C[10:0] of the circulation number counter 14 has changed. In this case, the D-FF 17 latches the count value C[10:0] of the circulation number counter 14 at the rising time of the reference clock CLK which has passed only the buffer 20 of one stage. Therefore, at time tb in FIG. 8, the circulation number count value C[10:0] is latched at the rising time of the reference clock CLK having passed through the buffer 20. Thus, the data "m+1" can be acquired in a stable state.

As shown in FIG. 7, the circulation number count value CF[10:0] is input to positive terminals of a subtractor 23 which is a set of subtractors provided for the most significant 11 bits. The circulation number count value CF[10:0] is also input to D input terminals of a D-FF 22 which is a set of D-FFs provided for the most significant 11 bits. As long as the signal EN is input as "H", the D-FF 22 latches the circulation number count value CF[10:0] at the rising time of the reference clock CLK having passed through the buffer 20. A Q output CFD[10:0] of the D-FF 22 is input to negative terminals of the subtractor 23.

Therefore, the subtractor 23 subtracts the circulation number count value CFD[10:0], which has been latched at the rising time of the previous reference clock CLK, from the circulation number count value CF[10:0] latched at the rising time of the reference clock CLK, and outputs the subtraction result value as data value DA[15:5] of the most significant 11 bits.

Thereby, a difference between the count value C[10:0] of the circulation number counter 14 during the rising time of the reference clock CLK can be output as a data value DA[15:5]. That is, the subtractor 23 digitally outputs the circulation number difference of the clock signal RCK between the rising times of the reference clock CLK as the data value DA[15:5].

Since the circulation number count value C[10:0] at the rising timing of the reference clock CLK is n+2 at time to in FIG. 8 and the circulation number count value C[10:0] is m+1 at the rising timing of the reference clock CLK at time tb in FIG. 8, for example, the subtractor 23 outputs a value of (m+1)−(n+2) as the data value DA[15:5].

Further, as shown in FIG. 7, the encoded signal enc_out [4:0] of the priority encoder 15 is input to D input terminals of a D-FF 24 which is a set of D-FFs provided for the least significant 5 bits. As long as the signal EN is "H", the D-FF 24 latches the encoded signal enc_out[4:0] at the rising timing of the reference clock CLK having passed through the buffer 20.

A Q output of the D-FF 24 is input to a positive input terminal of a subtractor 26 which is a set of subtractors provided for the least significant 5 bits and also to D input terminal of a D-FF 25 which is a set of D-FFs provided for the least significant 5 bits. The D-FF 25 also latches the Q output of the D-FF 24 at the rising time of the reference clock CLK having passed thorough the buffer 20 as long as the signal EN is "H".

A Q output enc_outd[4:0] of the D-FF 25 is input to negative input terminals of the subtractor 26. Therefore, the subtractor 26 subtracts the encoded signal enc_outd[4:0], which was latched at the rising time of the previous reference clock CLK, from the encoded signal enc_out[4:0] latched at the rising time of the reference clock CLK, and outputs the subtraction result value as a data value DA[4:0] of the least significant 5 bits. As a result, a difference between the encoded signal enc_out[4:0] between the rising times of the reference clock CLK can be output as the data value DA[4:0].

That is, referring back to the configuration of the preceding state of the priority encoder 15 shown in FIG. 6, a time difference between two time differences, one of which is between the rising time of the previous reference clock CLK and each rising time of the multi-phase clock signals RP [31:0] and the other of which is between the rising time of the present reference clock CLK and each rising time of the multi-phase clock signals RP [31:0], are output as the data value DA[4:0]. As a result, the data value CP=DA[15:0] is acquired.

This data value CP represents digital data of the period of the reference clock CLK including the data value DA[15:5] and the data value DA[4:0]. The data value DA[15:5] is the most significant 11 bits of the circulation number count value C[10:0] of the circulation clock signal RCK. The data value DA[4:0] is the least significant 4 bits of data of the time difference between the rising time of the reference clock CLK and each rising time of the multi-phase clock signal RP[31:0].

<Configuration of DCO 10 (Part 1)>

As shown in FIG. 2, the adder 6 adds the output data value CP of the TDC 9 and the frequency spreading command value F of the frequency spreading calculation unit 4, and outputs an addition result to the DCO 10. The DCO 10 inputs the multi-phase clock signals RP[31:0] and the circulation clock signal DCK from the RDL 8, inputs the data value CP+F from the adder 6, and outputs the clock pulse CKW based on these input signals and the data value.

Figure 9:
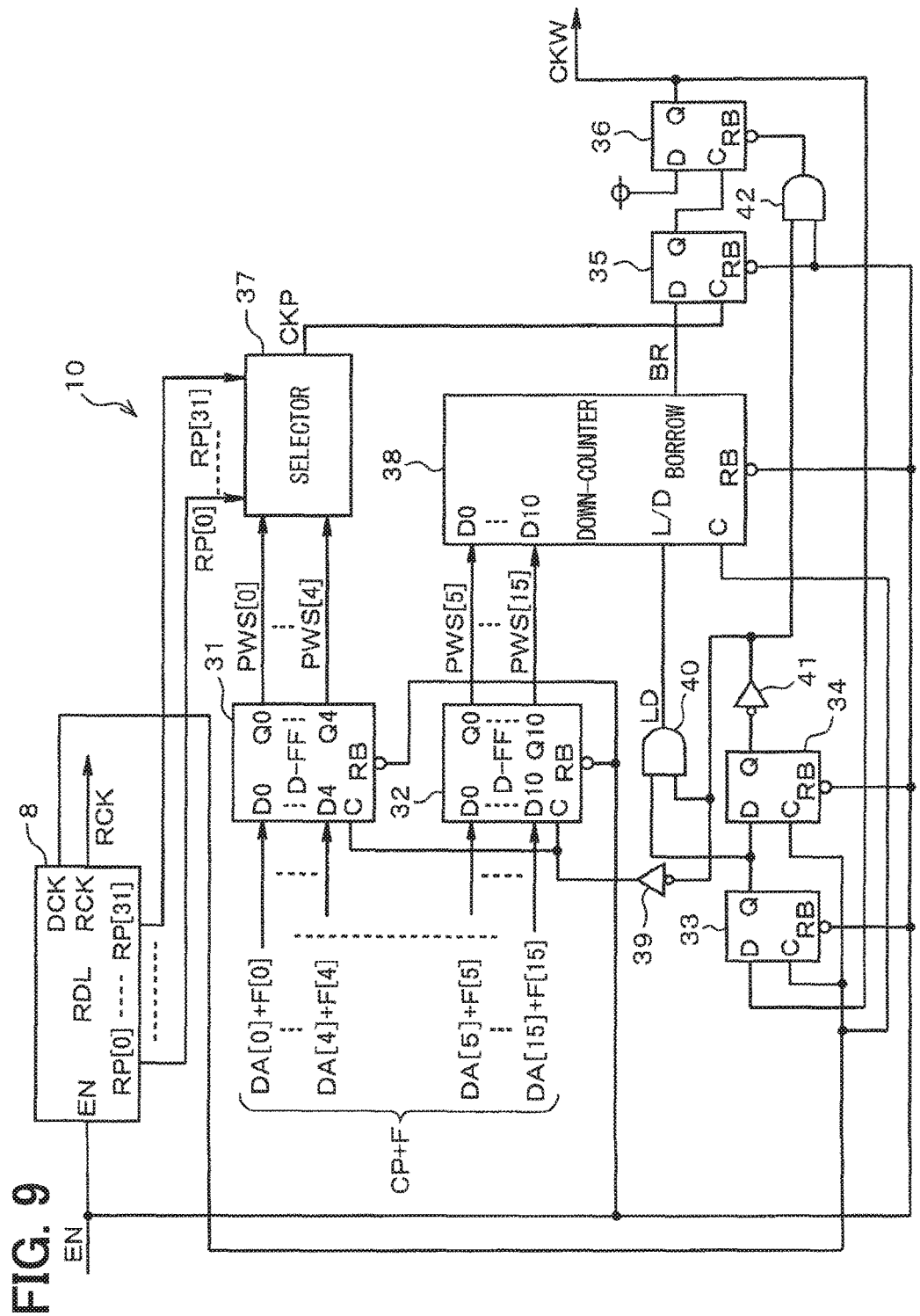
FIG. 9 is an electrical configuration diagram of the TDC.

As shown in the electrical configuration example of the DCO 10 in FIG. 9, the DCO 10 includes D-FFs 31 to 36, a selector 37, a down-counter 38 and various gates 39 to 42. Of the data value CP+F, the data value DA[15:5]+F[15:5] of the most significant 11 bits are input to D input terminals of the D-FF 32 and the data value DA[4:0]+F[4:0] of the least significant 5 bits is input to D input terminals of the D-FF 31. The holding time of the D input terminals of the D-FFs 31 and 32 will be described later.

<<Configuration of Selector 37 and Block Operation>>

Figure 10:
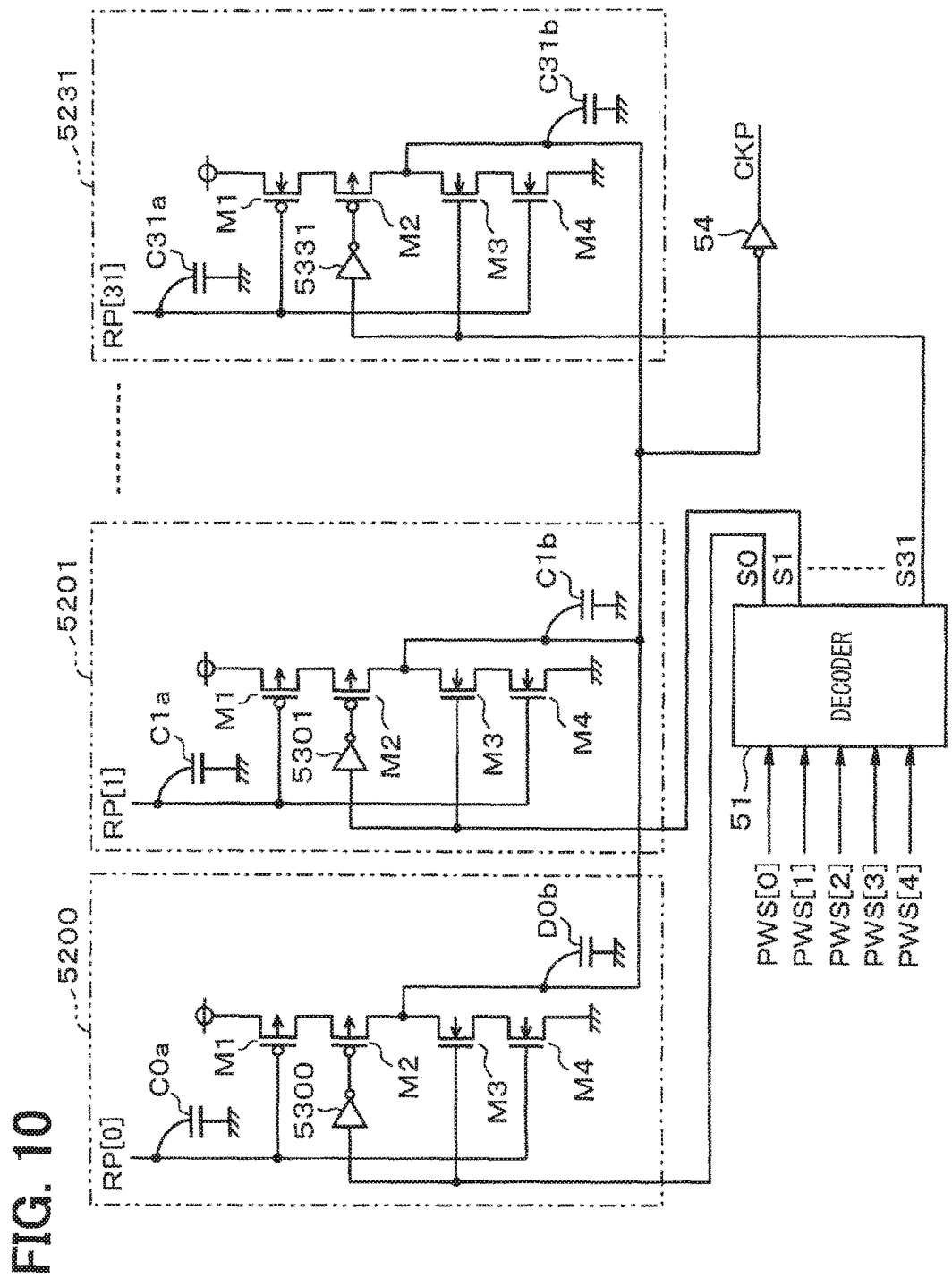
FIG. 10 is an electrical configuration diagram of a selector.

The selector 37 is a multi-phase clock selector, which is configured as shown in FIG. 10 for example. The selector 37 receives the least significant 5 bits of Q outputs PWS[4:0] of the D-FF 31, selects one clock signal out of the multi-phase clock signals RP[31] to RP[0] according to the value of the Q output PWS[4:0] of the D-FF 31, and outputs a selected clock signal CKP to a C input terminal of the D-FF 35. For example, the selector 37 is configured as shown in FIG. 10.

The selector 37 shown in FIG. 10 includes a decoder 51 and FET ladders 5200 to 5231 for $2^5$ bits. Each of the FET ladders 5200 to 5231 has two P-channel type MOSFETs (hereinafter referred to as PMOS transistors) M1 and M2 and two N-channel type MOSFETs (hereinafter referred to as NMOS transistors) M3 and M4, which are all connected in series between a positive power supply node and a ground node.

The multi-phase clock signals RP[0] to RP[31] are input to a gate of the PMOS transistor M1 out of the series circuits of the FET ladders 5200 to 5231 and are also input to a gate of the NMOS transistor M4. The decoder 51 decodes data PWS[4:0], and outputs decoded signals S[31] to S[0] of $2^5$ bits to the FET ladders 5231 to 5200, respectively.

The decoded signals S[31] to S[0] are input to the gates of the PMOS transistors M2 of the FET ladders 5231 to 5200 via inverting gates 5331 to 5300, respectively, and are input to the gates of the NMOS transistors M3 of the FE ladders 5231 to 5200, respectively. Therefore, the decoded signals S[31] to S[0] are complementarily input to the gates of the MOS transistors M2 and M3. A drain common connection point of the PMOS transistor M2 and the NMOS transistor M3 is commonly connected among the FET ladders 5231 to 5200 and this common connection point is connected to an input of a logic inverting gate 54. This logic inverting gate 54 externally outputs a clock pulse CKP.

As shown in FIG. 10, there are gate input wiring capacitances C0a to C31a up to the gate inputs of the MOS transistors M1 and M4 of the multi-phase clock signals RP[0] to RP[31]. However, the wiring layout is set so that the gate input wiring capacitances C0a to C31a are all substantially the same, that is, equal within an allowable range.

In addition, wiring capacitances C0b to C31b from selection output of the multi-phase clock signals RP[31:0] to an input of the logic inverting gate 54 are also set to be equal within an allowable range in the same manner as the wiring capacitances C0a to C31a. Thus, the wiring layout is configured so that wiring capacities from the terminals, to which the multi-phase clock signals RP[31:0] are input, to the output terminals are equal within an allowable range, respectively. As a result, the signal delay periods of the respective paths can be made equal within a predetermined range.

FIG. 11 shows an output correspondence table of the clock pulse CKP according to the value of the data PWS[4:0]. As the value of PWS[4:0] changes, the multi-phase clock signals RP[0] to RP[31] selected by the selector 37 also change and either one of the multi-phase clock signals RP[0] to RP[31] is output as the clock pulse CKP.

<<Configuration of Down Counter 38>>

Next, the down-counter 38 shown in FIG. 9 will be described with reference to FIG. 12. The down-counter 38 shown in FIG. 9 is configured to receive most significant 11 bits of the Q outputs of the D-FF 32, load the data PWS [15:5] as an initial value at the falling time of the load signal LD, and count down at the rising time of the clock signal DCK. As a specific example, the down-counter 38 is configured as shown in FIG. 12.

Figure 12:
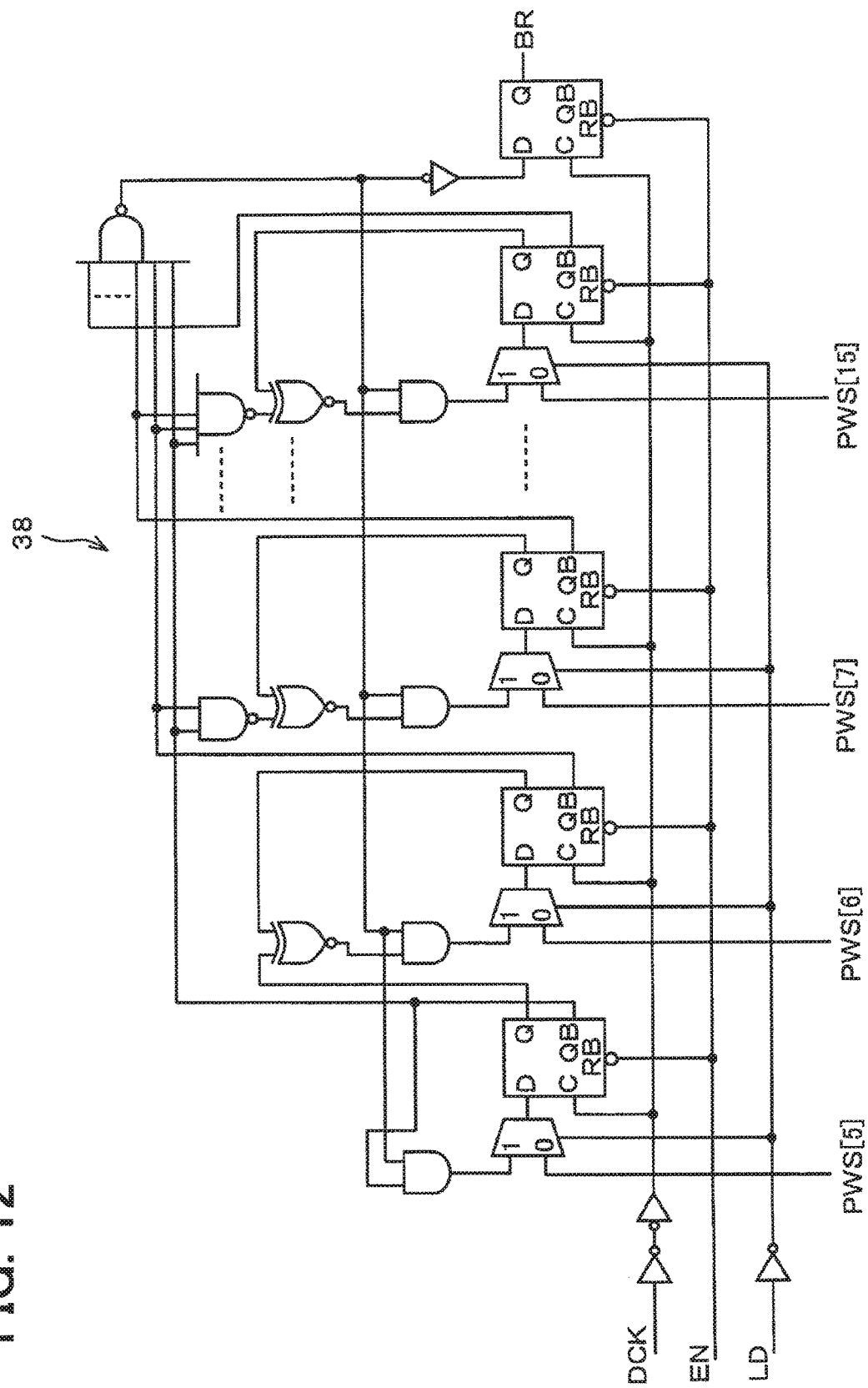
FIG. 12 is an electrical configuration diagram of a down-counter.

As shown in FIG. 12, the down-counter 38 loads the data PWS[5] to PWS[15] at a falling edge of the load signal LD in a state in which the signal EN is "H" and reset is released. Thereafter, each time the clock signal DCK rises, the down-counter 38 executes the down-counting operation. A borrow signal BR is a high-active borrow signal indicating that it becomes less than 0 during the down-count operation. Since the configuration of the down-counter 38 is conventional, no more details will be made. The input time of the load signal LD to a load control terminal L/D will be described later.

<Configuration of DCO 10 (Part 2)>

As shown in FIG. 9, the borrow signal BR of the down-counter 38 is input to a D terminal of the D-FF 35. The clock pulse CKP selected by the selector 37 is input to a C terminal of the D-FF 35. The D-FF 35 is released from resetting when the signal EN becomes "H". The AND gate 42 receives the signal EN at one input terminal thereof and the output of the logic inverting gate 41 to the other input terminal.

An output of the AND gate 42 is input to a low-active reset terminal of the D-FF 36. The D terminal of the D-FF 36 is connected to the positive voltage supply so as to be always at the active level. A Q output of the D-FF 35 is input to a C terminal of the D-FF 36. Therefore, while the AND gate 42 outputs "L", the D-FF 36 outputs "H" as the clock pulse CKW from the Q output terminal thereof at the time of receiving a rise input at the C terminal thereof from the Q output of the D-FF 35.

Further, the clock pulse CKW is input to a D terminal of the D-FF 33, and the clock signal DCK is input to a C terminal of the D-FF 33. The Q output of the D-FF 33 is input to a D terminal of the D-FF 34, and the Q output of the D-FF 33 is shifted.

The Q output of the D-FF 34 is inverted by the logic inverting gate 41. This inverted signal is input to one input terminal of an AND gate 42. This inverted signal is also input to C terminals of the D-FFs 31 and 32 via the logic inverting gate 39. A Q output of the D-FF 33 is applied to one input terminal of the AND gate 40. An output of the logic inverting gate 41 is applied to the other input terminal of the AND gate 40. An output of the AND gate 40 is input as a load signal LD to a signal input terminal L/D of the down-counter 38. As a result, the down counter 38 counts down the most significant 11 bits of the data value CP+F. It is possible to generate the clock pulse CKW at the rising time of the multi-phase clock signal (either one of RP[0] to RP[31]) selected by the least significant 5 bits of the data value CP+F during generation of the borrow signal BR of the down-counter 38, as described later.

Characteristic functions and operations of the above configuration will mainly be described. The frequency spreading circuit 3 shown in FIG. 1 starts its operation when the signal EN becomes "H". The frequency spreading calculation unit 4 receives the frequency spreading factor A % and the frequency spreading period FB[s] as the command values, and calculates the frequency spreading command value F according to the command values. The frequency spreading calculation unit 4 preferably includes a microcomputer formed of a CPU and a memory so that the CPU calculates the frequency spreading command value F by execution of computer programs stored in the memory.

Figure 13:
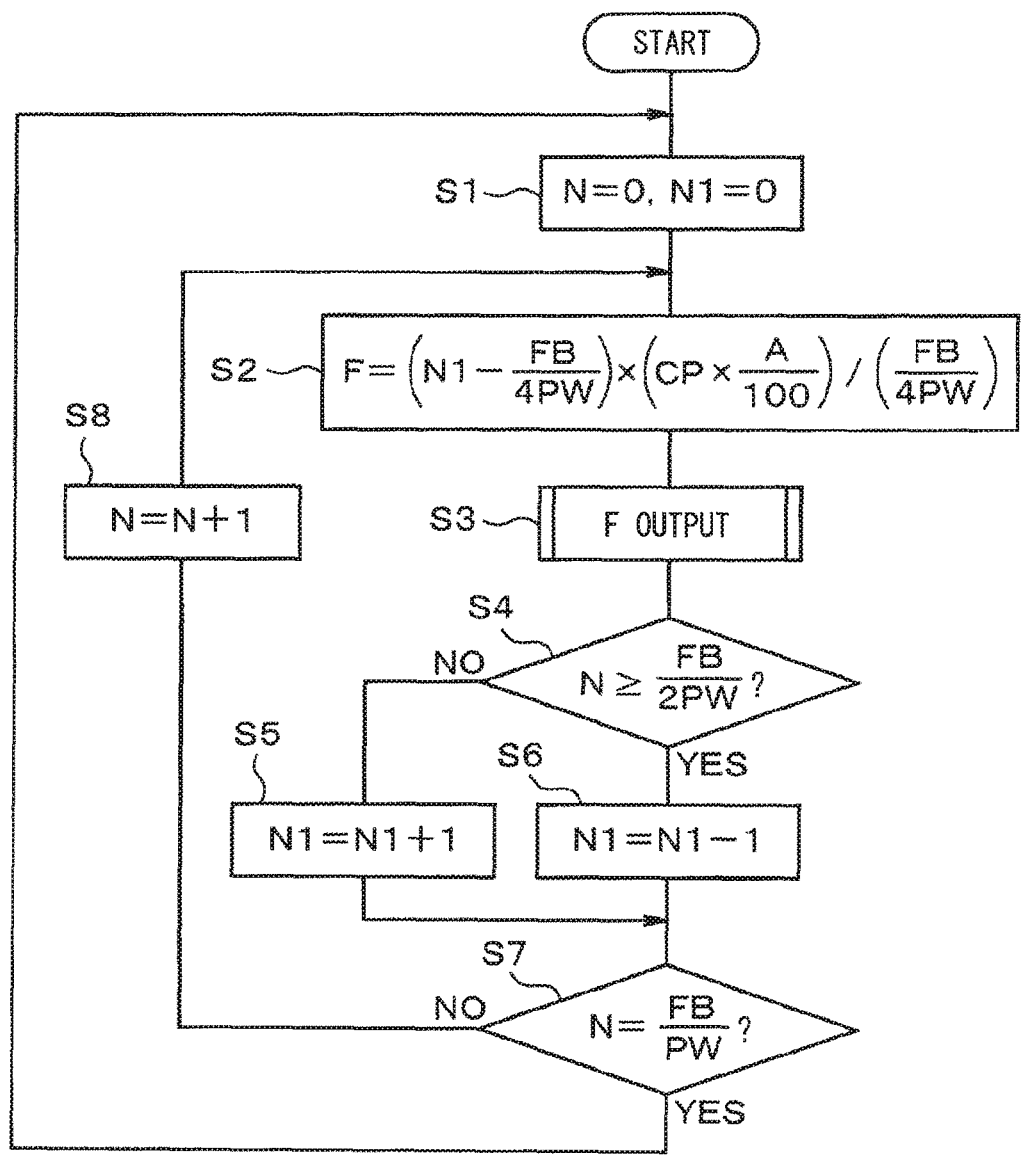
FIG. 13 is a flowchart showing calculation contents of a frequency spreading calculation unit.
Figure 14:
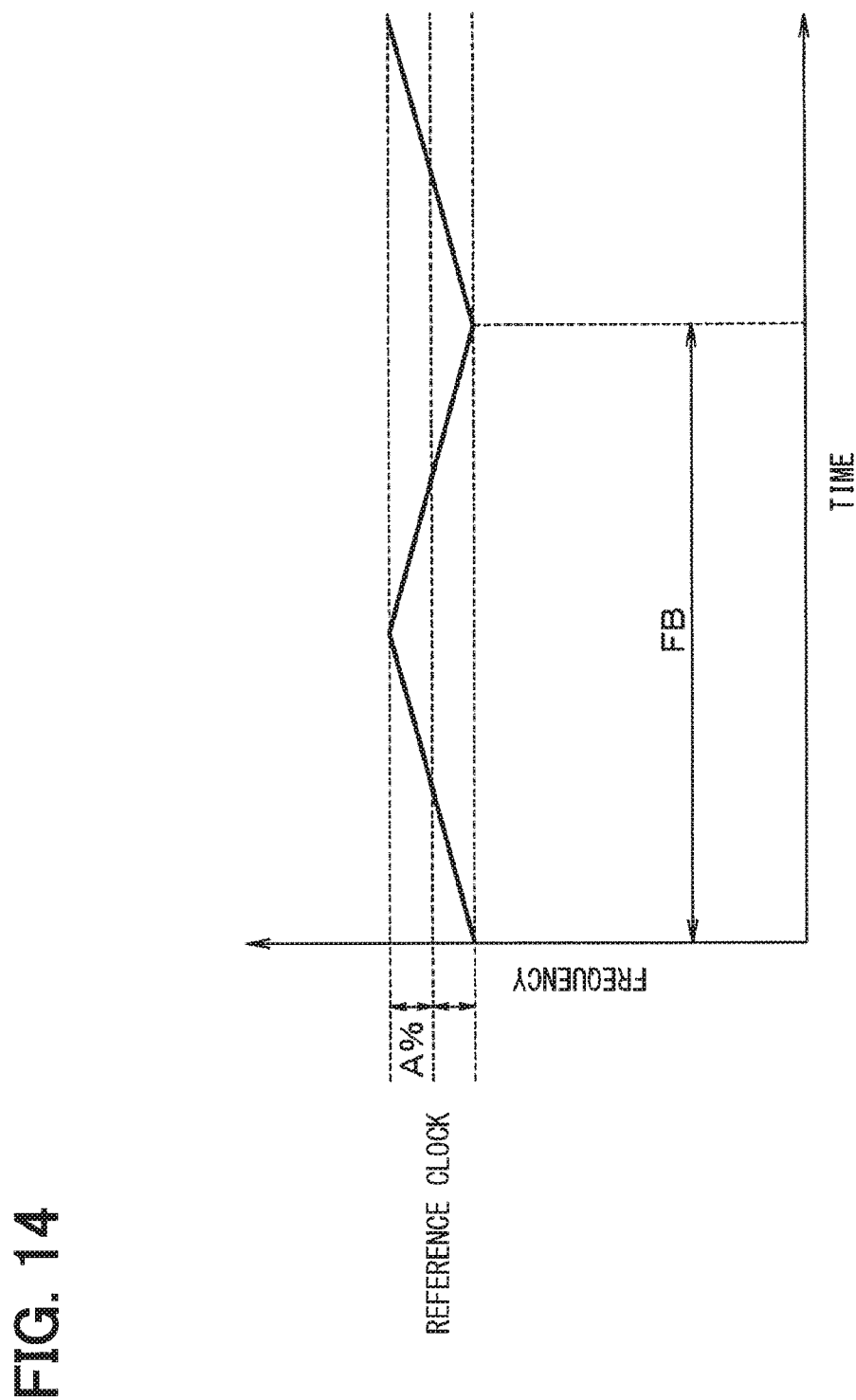
FIG. 14 is a time chart schematically showing frequency changes with time.

FIG. 13 is a flow chart showing a method of calculating the frequency spreading command value F by the CPU. FIG. 14 is a time chart showing a change of the frequency spreading command value F. The method of calculating the frequency spreading command value F shown in FIG. 13 shows a method of outputting the frequency spreading command value F when frequency spreading is executed with the frequency spreading period FB as one period as shown in FIG. 14. Specifically, it shows the method of calculating the frequency spreading command value F at the time of outputting N pulses of the reference clock CLK (however, the standard value PW (=½ MHz) of the period of the reference clock CLK) per frequency spreading period FB.

As shown in FIG. 13, the frequency spreading calculation unit 4 sets a timer variable N=0 and a calculation variable value to N1=0 in S1, calculates the frequency spreading command value by the following equation (1) in S2 and outputs the calculated frequency spreading command value F to the adder 6 in S3.

$$F=(N1-FB/4PW) \times (CP \times A/100)/(FB/4PW) \qquad (1)$$

In the equation (1), an initial value of the frequency spreading command value F is set to correspond to the variables N=0 and N1=0 so that the frequency spreading command value F is calculated as F=−CP×A/100. In addition, by setting the frequency spreading command value F at a half period of the frequency spreading period FB to correspond to the variables N=FB/2PW and N1=FB/2PW, the frequency spreading command value F is calculated as F=CP×A/100.

Then, in S4, the frequency spreading calculation unit 4 checks whether the variable N satisfies N≥FB/2PW, that is, whether the half period of the frequency spreading period FB has been reached. In case that the half period has not been reached In S5, the variable is continuously varied as N1=N1+1. In case that it has reached the half period, the variable is continuously varied as N1=N1−1 in S6. Then, in S2, the frequency spreading calculation unit 4 sequentially calculates the equation (1) and outputs the frequency spread command value F. The frequency spreading calculation unit 4 checks in S7 whether N=FB/PW is satisfied, that is, whether the one period of the frequency spreading period FB has been reached. In case the one period has not been reached, steps following S2 is repeated by setting the variable N as N=N+1 in S8. In case that the one period has been reached, the variables N and N1 are cleared to 0 in S1. Then the processing of the next period is executed in S2 and subsequent steps.

For this reason, the frequency spreading calculation unit 4 sequentially calculates the frequency spreading command value F of the equation (1) which changes according to the value of the variable N1 and the period data value CP of the frequency-pulse conversion unit 5 and outputs it to the adder 6.

For example, assuming that the period data value CP of the frequency-pulse conversion unit 5 is constant, the frequency spreading calculation unit 4 sequentially outputs the frequency spreading command value F, which gradually increases linearly in a former half period and linearly gradually decreases in a latter half period, as shown in FIG. 14. Actually, even if the period of the multi-phase clock signal RP[ ] of the RDL 8 changes every one pulse, the influence of this period change is reflected in the period data value CP of the reference clock CLK. Thus, by calculating the frequency spreading command value F using the equation (1), the change is reflected on the frequency spreading command value F.

Figure 15:
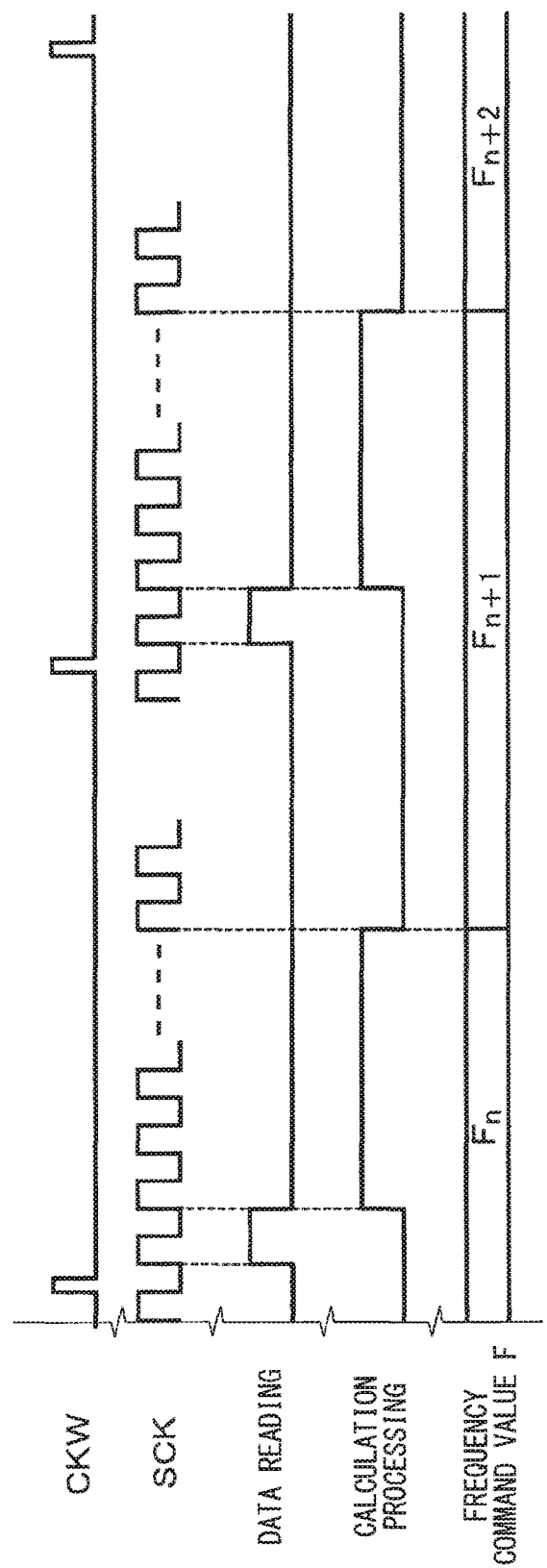
FIG. 15 is a time chart showing a relationship between calculation processing based on a clock pulse and an output result of a frequency command value.

FIG. 15 is a diagram showing a relationship between output time of the frequency spreading command value F and output time of the clock pulse CKW. As shown in FIG. 15, the frequency spreading calculation unit 4 receives the system clock SCK. The frequency spreading calculation unit 4 further receives the frequency spreading factor A %, the frequency spreading period FB and the period data value CP of the frequency-pulse conversion unit 5 in synchronization with the generation time of the system clock SCK and thereafter executes the calculation processing according to these data. Upon completion of the calculation processing, the frequency spreading calculation unit 4 outputs the frequency spreading command value F, but outputs the clock pulse CKW corresponding to the frequency spreading command value F after processing by the adder 6 and the frequency-pulse conversion unit 5.

Then, upon receiving this clock pulse CKW, the frequency spreading calculation unit 4 receives the above data (frequency spreading rate A %, frequency spreading period FB and period data value CP) in synchronism with the generation time of the system clock SCK thereafter and executes calculation processing according to these data. When the frequency spreading factor A and the frequency spreading period FB do not change each time the frequency spreading command value F changes, the frequency spreading calculation unit 4 may retrieve only the period data value CP of the frequency-pulse conversion unit 5 and executes the calculation processing.

<Operation of DCO 10>

On the other hand, when the signal EN becomes "H", the frequency-pulse conversion unit 5 also starts its operation. When the RDL 8 outputs the clock signal DCK to the DCO 10, the clock signal DCK is input to the C terminal of the down-counter 38 shown in FIG. 9.

Figure 16:
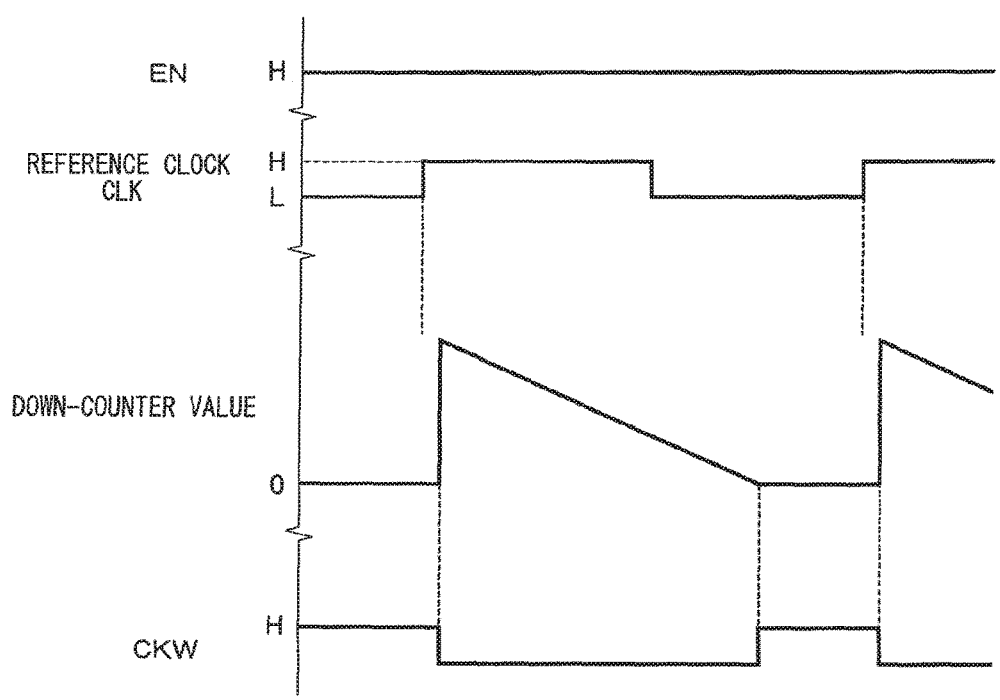
FIG. 16 is a time chart showing a relation among a reference clock, a clock pulse and a down-counter value.

On the other hand, although the circulation number counter 14 in FIG. 5 counts the clock signal RCK and changes the count value C[10:0], the TDC 9 shown in FIG. 7 outputs the period between the rising times of the reference clock CLK as the period data value DA[15:0] when the reference clock CLK repeatedly generates the rising edges as shown in FIG. 16.

The down-counter 38 counts down the most significant bits (DA[5]+F[5] to DA[15]+F[15]) of the data value CP+F, which is acquired by adding the frequency spreading command value F to the period data value DA[15:0], to 0 and generates the borrow BR. As shown in FIG. 16, when the down-counter value decreases to 0 and the borrow BR occurs, the clock pulse CKW is generated.

Figure 17:
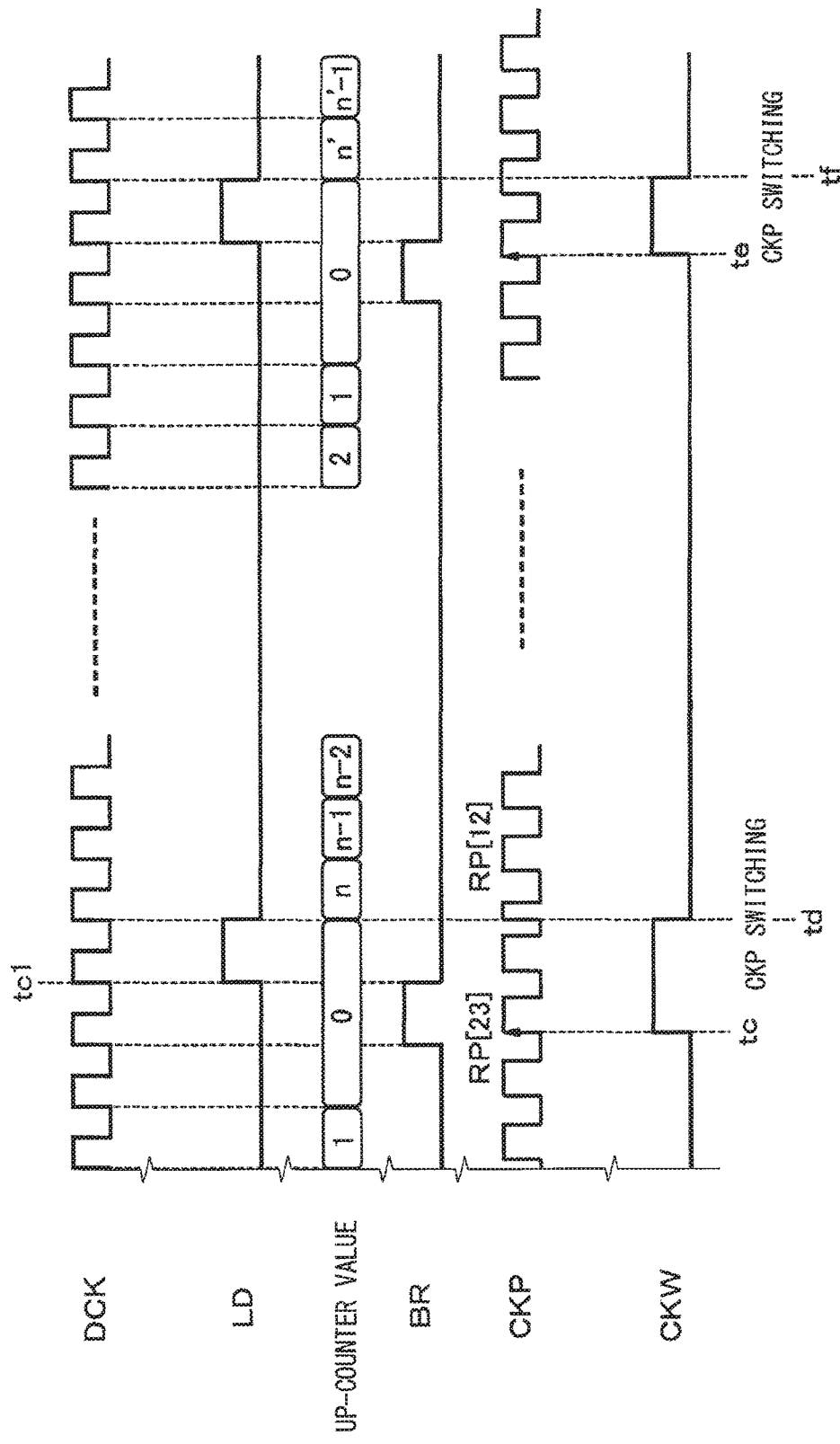
FIG. 17 is a time chart of a DCO.

Details are shown in FIG. 17. The borrow BR is generated as shown in FIG. 17 at time when the down-counter 38 counts down to 0 and the next clock signal DCK rises. This borrow BR is generated for a time length equal to one period of the clock signal DCK. The clock signal CKP, which is input to the C terminal of the D-FF 35 while the borrow BR is set to "H", is the multi-phase dock signal (for example, RP[23]), which is any one of the multi-phase clock signals RP[0] to RP[31] selected according to the latch value [4:0] of the D-FF 31.

Therefore, as shown at time tc in FIG. 17, the rising edge of the clock pulse CKW can be generated at the time of rising of the clock signal (for example, RP[23]) selected out of the multi-phase clock signals RP[0] to RP[31].

Then, the borrow BR is canceled to "L" at the next generation time tc1 of the clock signal DCK. At the same time, since the D-FF 33 outputs "H" at the Q output, the AND gate 40 generates "H" of the load signal LD.

Further, at the next generation time td of the clock signal DCK, the D-FF 34 outputs "H" at the Q output terminal. Thus, the output of the logic inverting gate 41 becomes "L" and the output load signal LD of the AND gate 40 becomes "L". At this time, the down-counter 38 loads the data PWS[15:5]. At the same time, the AND gate 42 resets the D-FF 36 and lowers the clock pulse CKW to "L".

On the other hand, the selector 37 switches the multi-phase clock signal RP from RP[23] to RP[21], for example, in accordance with the value PWS[4:0] of the least significant 5 bits latched by the output of the logic inverting gate 39 to the C terminal of the D-FF 31 and D-FF 32, and outputs the multi-phase clock signal RP[12] as the clock pulse CKP.

The down-counter 38 loads the most significant 11 bits DA[5]+F[5] to DA [15]+F[15] of the data value CP+F at the falling time of the load signal LD, and then counts down in accordance with the circulation clock signal DCK. Then the down-counter 38 generates the clock pulse having the rising edge at the rising time to of the multi-phase clock signal RP[12] during the "H" generation period (corresponding to "count completion") of the borrow BR of the down-counter 38 generated corresponding to the next rising time of the reference clock CLK. It should be noted that the clock pulse CKW has the falling edge at the falling time tf of the load signal LD as described above.

At this time, the period between the rising times of the clock pulses CKW can be generated in accordance with the frequency spreading command value F. Further, the clock pulse CKW having a period corresponding to the frequency spreading command value F, which is determined by the equation (1) by using the period data value CP of the reference clock CLK.

Figure 18:
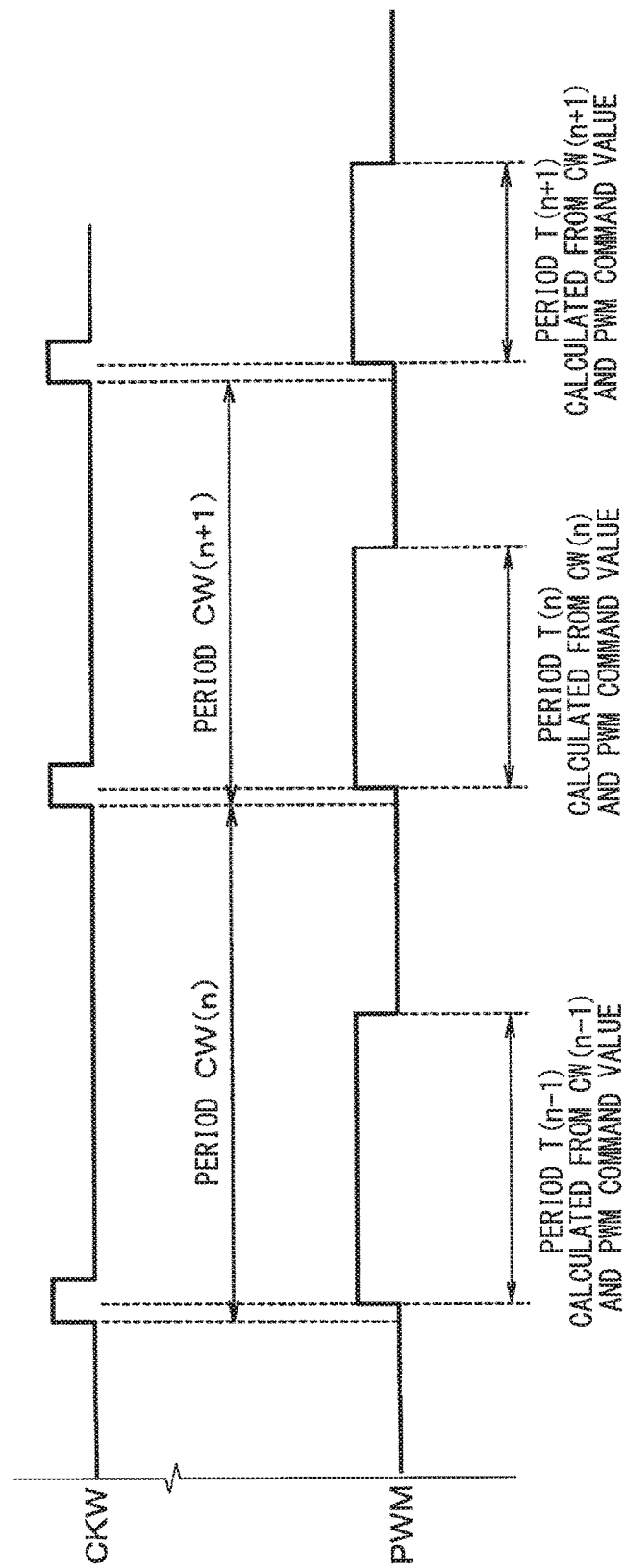
FIG. 18 is a time chart showing a relationship between a clock pulse and a PWM signal by the PWM generation unit.

Referring back to FIG. 1 again, the PWM generation unit 7 receives this clock pulse CKW, inputs a PWM command duty ratio (PWM command value), generates the PWM signal, and outputs it to the switching power supply unit 2. FIG. 18 shows a relationship between the clock pulse CKW and the PWM signal. The PWM generation unit 7 measures the interval between the rising times of the clock pulse CKW generated by the frequency-pulse conversion unit 5, sets this period as CW(n). The PWM generation unit 7 receives the PWM command value, calculates a pulse width period T(n) of the PWM signal in accordance with the received PWM command value, and generates the PWM signal at the next generation time of the clock pulse CKW. As a result, the PWM signal can be continuously output to the switching power supply unit 2. The switching power supply unit 2 generates a switching power supply voltage according to the PWM signal. The switching power supply voltage may be generated in the well-known manner and hence no detailed explanation will be made.

Features of Present Embodiment

In summary, according to the present embodiment, the TQC 9 measures the period of the reference clock CLK as the period data value CP by the multi-phase clock signals RCK, RP[31:0] of the RDL 8, and the frequency spreading calculation unit 4 calculates the frequency spreading command value F according to the inputted frequency spreading factor A, frequency spreading period FB and period data value CP of the reference clock CLK, and the frequency-pulse conversion unit 5 generates the clock pulse CKW, which corresponds to the frequency spreading command value F, according to the data value CP+F determined by adding the frequency spreading command value F to the period data value CP by the adder 6. Thereby, it is possible to provide the frequency spreading circuit 3 capable of digitally spreading out the frequency with the resolution of the delay period Td of the delay buffers 11a, 11b and 12 of the RDL 8. By adopting such a configuration, it is possible to cope with frequency modulation in a high frequency band while without necessitating analog circuits.

In particular, due to the characteristics of the logic inverting gates 11a, 11b and 12, the RDL 8 has a characteristic change due to a temperature change (that is, temperature characteristic), a characteristic change due to a power supply voltage change (abbreviated as electric characteristic) and the like as well as variations in structural component elements. For this reason, in the first embodiment, the period data value CP of the reference clock CLK is measured by using the RDL 8, and the frequency spreading calculation unit 4 correctively calculates the frequency spreading command value F based on the period data value CP of the reference clock CLK and generates the clock pulse CKW.

Therefore, it is possible to correct variations in the temperature characteristics, the electric characteristics, and the structural component element values of the RDL 8. It is thus possible to realize the frequency spreading circuit 3, which is capable of changing the frequency with the resolution of the gate delay period of each of the logic inverting circuits 11a, 11b, 12 and 13 of the RDL 8. Also, by using such a frequency spreading circuit 3, the occurrence of EMI can be suppressed.

Further, the down-counter 10 is loaded with the most significant 11 bits of the data value CP+F determined by adding the frequency spreading command value F to the period data value CP of the reference clock CLK and executes its counting operation by the clock signal DCK circulating around the RDL 8. The selector 37 selects one of the multi-phase clock signals RP[0] to RP[31] according to the least significant 5 bits of the data value CP+F. Thus, the frequency-pulse conversion unit 5 generates the clock pulse CKW in accordance with the multi-phase clock signal RP[ ] selected by the selector 37 at time during the period of generation of the borrow BR, which indicates the completion of the counting operation after loading by the down-counter 10. As a result, the resolution of the period of the clock pulse CKW can be increased.

Thus, since the wiring layout is configured so that the wiring capacities from the terminals, to which the multi-phase clock signals RP[31:0] are input, to the output terminals are equal within an allowable range, respectively, the signal delay periods of the paths are equalized within the predetermined range.

Second Embodiment

Figure 19:
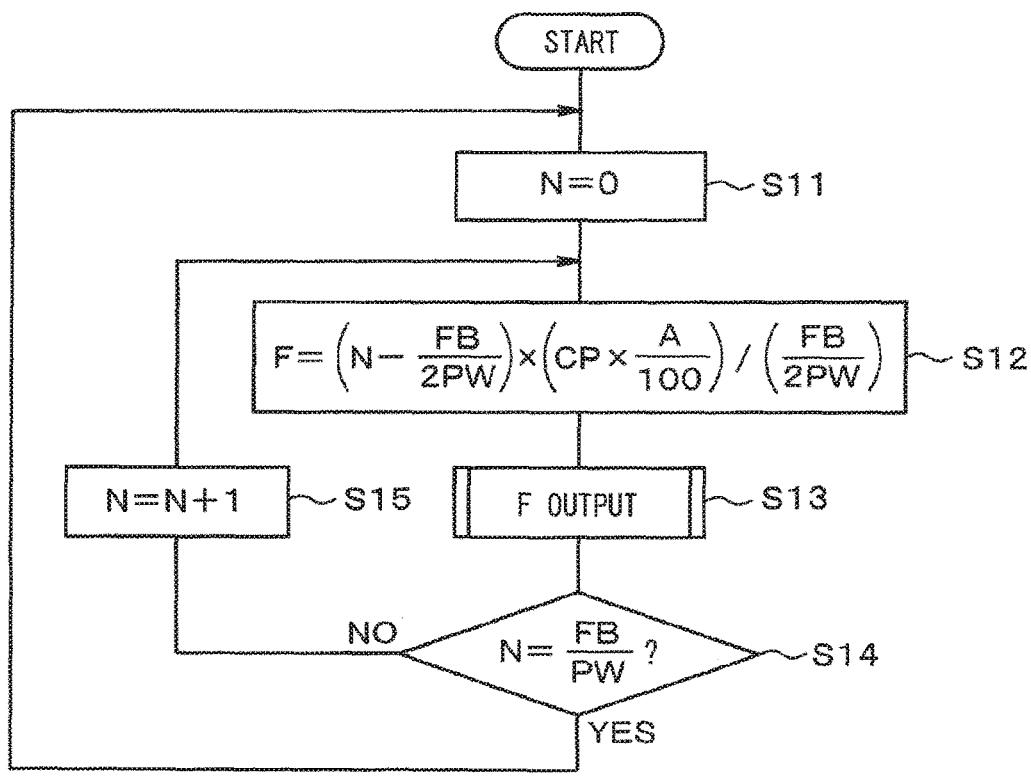
FIG. 19 is a flowchart showing calculation contents of a frequency spreading calculation unit in a second embodiment.
Figure 20:
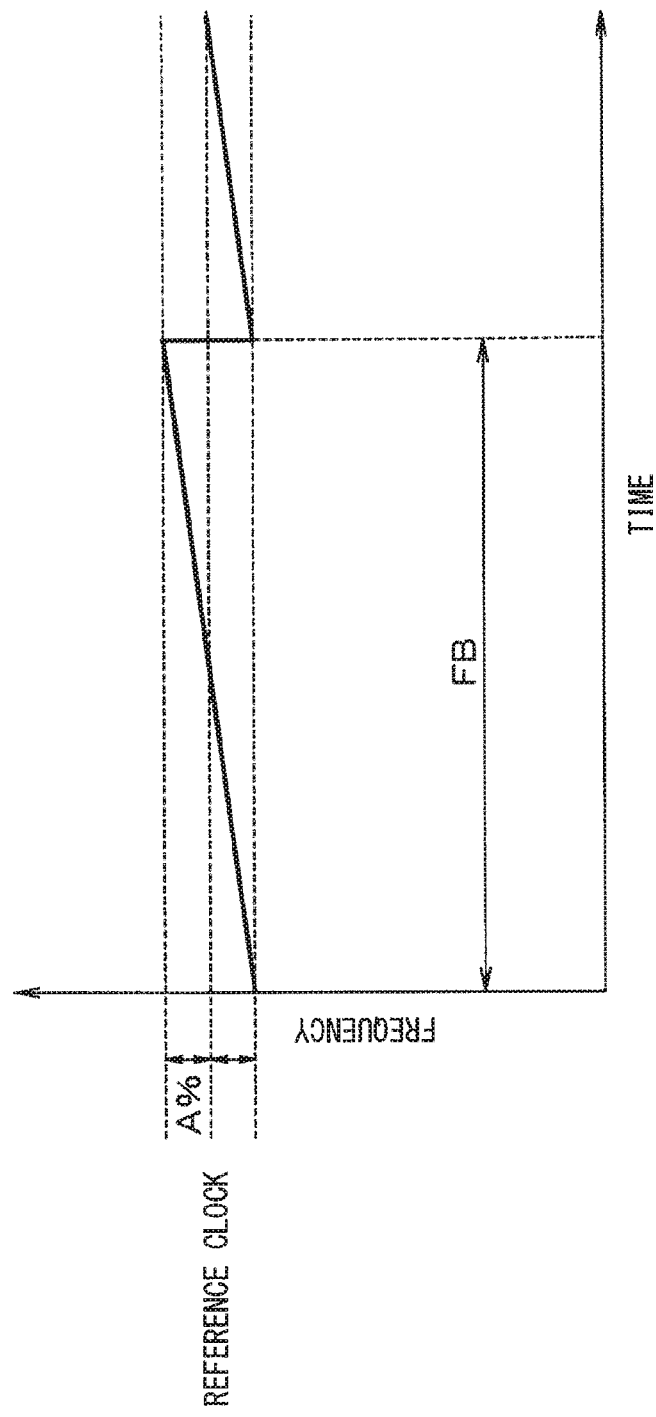
FIG. 20 is a time chart schematically showing frequency changes with time.

FIG. 19 and FIG. 20 show additional explanatory diagrams of a second embodiment. FIG. 19 shows a method of outputting the frequency spreading command value F in comparison to the method shown in FIG. 13. FIG. 20 shows a change of the frequency spreading command value F in comparison to the change shown in FIG. 14. The same structural or functional parts as those in the first embodiment are designated with the same reference numerals, and only differences from the first embodiment will be described.

As shown in FIG. 19, the frequency spreading calculation unit 4 sets the variable N=0 in S11, calculates the frequency spreading command value as defined by the following equation (2) in S12, and outputs the calculated frequency spreading command value F to the adder 6 in S13.

$$F=(N-FB/2PW)\times(CP\times A/100)/(FB/2PW) \quad (2)$$

In this equation (2), the initial value of the frequency spreading command value F is set to correspond to the variable N=0, so that the frequency spreading command value F is calculated as F=−CP×A/100. In addition, by setting the final frequency spreading command value F of the frequency spreading period FB to N=FB/PW, the frequency spreading command value F is calculated as F=CP×A/100.

Then, in S14, the frequency spreading calculation unit 4 checks in S14 whether N=FB/PW is satisfied, that is, whether the one period of the frequency spreading period FB has been reached. In case the one period has not been reached, steps following S12 are repeated by setting the variable N as N=N+1 in S15. In case that the one period has been reached, the variable N is cleared to 0 in S11. Then the processing of the next period is executed in S2 and subsequent steps. For this reason, the frequency spreading calculation unit 4 outputs to the adder 6 the frequency spreading command value F of the equation (2), which varies with the value of the variable N and the period data value CP of the frequency-pulse conversion unit 5. In the present embodiment, assuming that the period data value CP of the reference clock CLK is made to be constant, the frequency spreading calculation unit 41 outputs the frequency spreading command value F, which gradually increases linearly in the one period FB as shown in FIG. 19. Therefore, the second embodiment provides the same effect as the first embodiment.

Third Embodiment

Figure 21:
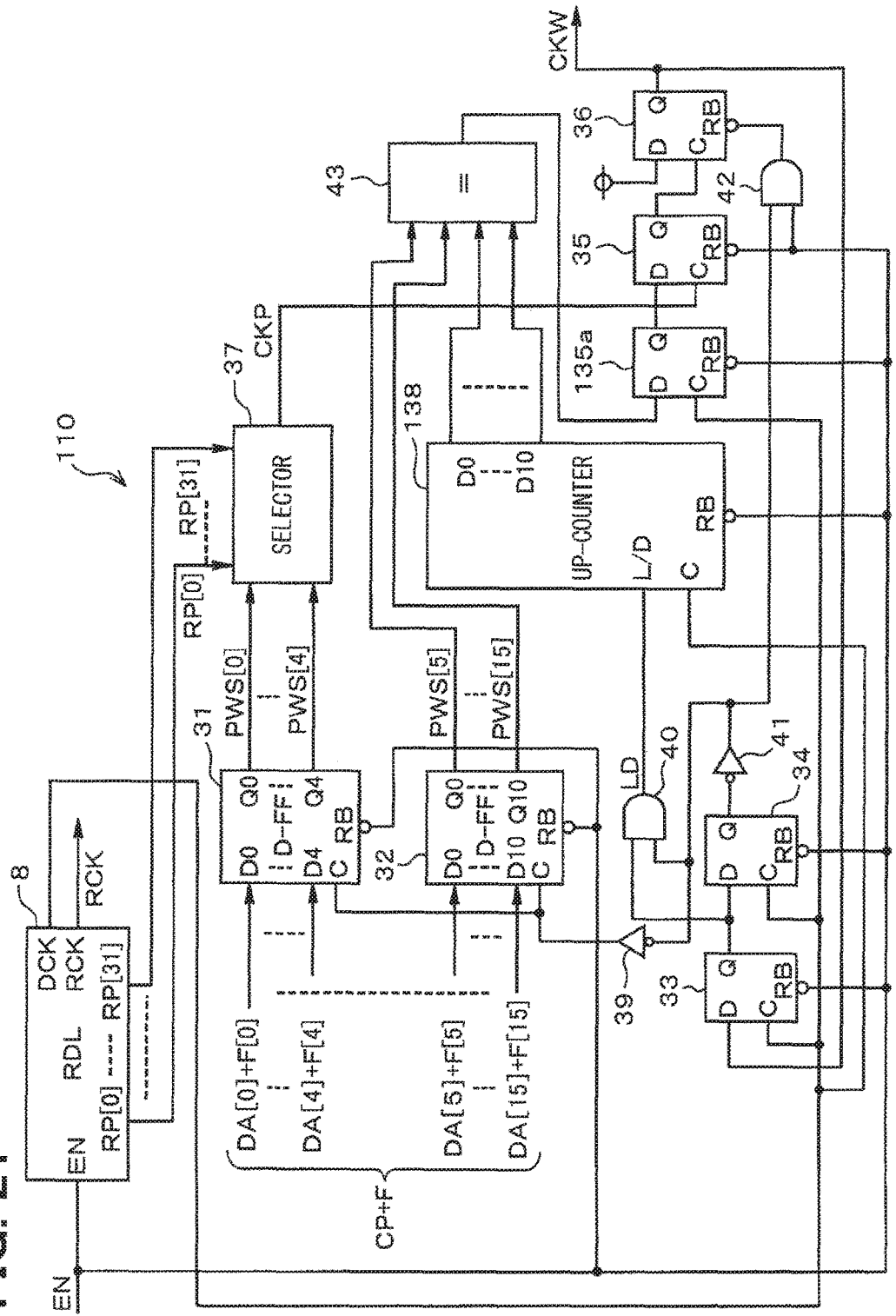
FIG. 21 is an electrical configuration diagram of a DCO in a third embodiment.
Figure 22:
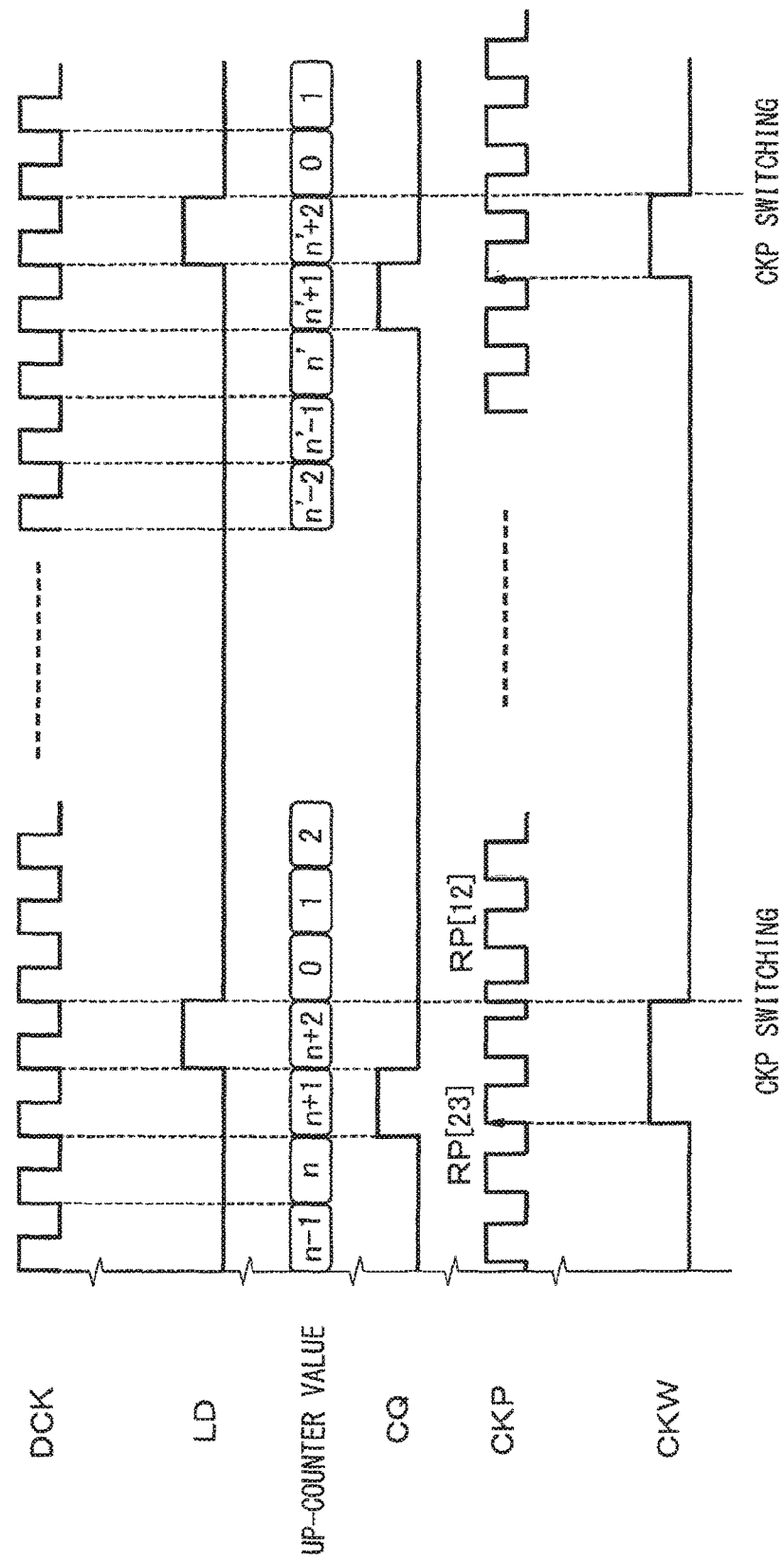
FIG. 22 is a time chart of the DCO.

FIG. 21 and FIG. 22 show additional explanatory diagrams of a third embodiment. FIG. 21 shows a configuration example of a DCO 110. The DCO 110 is provided with an up-counter 138 in place of the down-counter 38 and an equivalence check unit 43 in the subsequent stage. The equivalence check unit 43 checks whether a D output of the most significant 11 bits of the up-counter 138 and the Q output of the most significant 11 bits of the D-FF 32 are equal, and outputs "H" to a D terminal of a D-FF 135a at the time of determination of equivalence. The D-FF 135a is configured to output the output of the equivalence check unit 43 as a Q output in response to the clock signal DCK as long as the signal EN is "H". The D-FF 35 is connected to the D-FF 135a as the subsequent stage. Other configurations including the D-FF 35 are the same as those of the DCO 10 shown in FIG. 9 and described in the first embodiment, and therefore no more description thereof is made.

In this case, as shown in a time chart of FIG. 22, the counter output D[10:0] of the up-counter 138 can generate a rising edge of the clock pulse CKW in accordance with the rising time of the selected multi-phase clock signal RP[ ] (RP[23] to RP[12] in FIG. 22) which is generated in the same period as the output PWS[15:5] of the D-FF 32. Thereby, the third embodiment also provides the same operation and effect as the above-described embodiments which are configured by using the down-counter 38.

Other Embodiment

The present disclosure is not limited to the embodiments described above but may be modified or expanded, for example, as described below.

Although the frequency spreading factor A % and the frequency spreading period FB are input from the external side in the above-described embodiments, these values may be stored in advance in a memory or a register, or may be applied by radio communication from the external side.

Although the PWM generation unit 7 receives the clock pulse CKW and generates the PWM signal according to the command duty ratio in the above-described embodiments, a signal of the carrier frequency of the frequency spreading command value F corresponding to the clock pulse CKW may be output.

The electrical configurations of the DCOs 10 and 110 are only exemplary and are not limited to the disclosed configurations. That is, although the configuration using the down-counter 38 or the up-counter 138 is shown, the configuration is not limited to these configurations.

In the drawings, reference numeral 4 denotes the frequency spreading operation unit, 5 the frequency-pulse conversion unit (pulse generation unit), 8 the RDL (ring oscillator), 9 the TDC (period measuring unit), 11*a* and 11*b* the NAND gates (logic inverting gates), RP[0] to RP[31] the multi-phase clock signals, DCK and RCK the clock signals, and CKW the clock pulse.

The configurations and functions of the plural embodiments described above may be combined. A part of the above-described embodiment may be dispensed/dropped as long as the problem identified in the background is resolvable. In addition, various modifications from the present disclosure in the claims are considered also as an embodiment thereof as long as such modification pertains to the gist of the present disclosure.

Although the present disclosure is made based on the above-described embodiments, the present disclosure is not limited to the disclosed embodiments and configurations. The present disclosure covers various modification examples and equivalent arrangements. In addition, various modes/combinations, one or more elements added/subtracted thereto/therefrom, may also be considered as the present disclosure and understood as the technical thought thereof.

What is claimed is:

1. A frequency spreading circuit comprising:
a ring oscillator configured with a multiple number of logic inverting circuits in a ring shape for generating multi-phase clock signals;
a period measuring unit configured to measure a period of a reference clock, which is inputted, by the multi-phase clock signals of the ring oscillator and output a measured period as a period data value;
a frequency spreading calculation unit configured to calculate a frequency spreading command value in accordance with a frequency spreading rate, a frequency spreading period and the period data value of the period measuring unit, which are inputted; and
a pulse generation unit configured to generate a clock pulse corresponding to the frequency spreading command value in accordance with a data value determined by addition of the frequency spreading command value to the period data value.

2. The frequency spreading circuit according to claim 1, wherein:
the pulse generation unit includes a counter and a multi-phase clock selector;
the counter is loaded with most significant bits of the data value determined by adding the frequency spreading command value to the period data value and executes a count operation of a clock signal synchronized with one of the multi-phase clock signals;
the multi-phase clock selector selects one of the multi-phase clock signals in accordance with least significant bits of the data value determined by adding the frequency spreading command value to the period data value; and
the pulse generation unit generates the clock pulse at a time in a period between loading of the most significant bits of the data value to the counter and completion of counting of the most significant bits of the data value by the counter, the time corresponding to the multi-phase clock signal selected by the multi-phase clock selector.

3. The frequency spreading circuit according to claim 2, wherein:
the multi-phase clock selector has a wiring layout configuration, which substantially equalizes wiring capacitances from input terminals, to which the multi-phase clock signals are input, to output terminals, respectively.

4. The frequency spreading circuit according to claim 3, wherein:
the frequency spreading calculation unit is configured to calculate the frequency spreading command value as $F=(N1-FB/4PW)\times(CP\times A/100)/(FB/4PW)$ sequentially while varying continuously a calculation variable value N1 from 0 to FB/2PW and from FB/2PW to 0, assuming that A is the frequency spreading rate, FB is the frequency spreading period, CP is the period data value of the period measuring unit and PW is a period of the reference clock.

5. The frequency spreading circuit according to claim 3, wherein:
the frequency spreading calculation unit is configured to calculates the frequency spreading command value as $F=(N-FB/2PW)\times(CP\times A/100)/(FB/2PW)$ sequentially while varying continuously a calculation variable value N from 0 to FB/2PW, assuming that A is the frequency spreading rate, FB is the frequency spreading period, CP is the period data value of the period measuring unit and PW is a period of the reference clock.

6. The frequency spreading circuit according to claim 2, wherein:
the frequency spreading calculation unit is configured to calculate the frequency spreading command value as $F=(N1-FB/4PW)\times(CP\times A/100)/(FB/4PW)$ sequentially while varying continuously a calculation variable value N1 from 0 to FB/2PW and from FB/2PW to 0, assuming that A is the frequency spreading rate, FB is the frequency spreading period, CP is the period data value of the period measuring unit and PW is a period of the reference clock.

7. The frequency spreading circuit according to claim 2, wherein:
the frequency spreading calculation unit is configured to calculates the frequency spreading command value as $F=(N-FB/2PW)\times(CP\times A/100)/(FB/2PW)$ sequentially while varying continuously a calculation variable value N from 0 to FB/2PW, assuming that A is the frequency spreading rate, FB is the frequency spreading period, CP is the period data value of the period measuring unit and PW is a period of the reference clock.

8. The frequency spreading circuit according to claim 1, wherein:
the frequency spreading calculation unit is configured to calculate the frequency spreading command value as F=(N1−FB/4PW)×(CP×A/100)/(FB/4PW) sequentially while varying continuously a calculation variable value N1 from 0 to FB/2PW and from FB/2PW to 0, assuming that A is the frequency spreading rate, FB is the frequency spreading period, CP is the period data value of the period measuring unit and PW is a period of the reference clock.

9. The frequency spreading circuit according to claim 1, wherein:
the frequency spreading calculation unit is configured to calculates the frequency spreading command value as F=(N−FB/2PW)×(CP×A/100)/(FB/2PW) sequentially while varying continuously a calculation variable value N from 0 to FB/2PW, assuming that A is the frequency spreading rate, FB is the frequency spreading period, CP is the period data value of the period measuring unit and PW is a period of the reference clock.

\* \* \* \* \*